(12) United States Patent
Nakagawa et al.

(10) Patent No.: US 9,977,191 B2
(45) Date of Patent: May 22, 2018

(54) OPTICAL CONNECTING METHOD

(71) Applicant: International Business Machines Corporation, Armonk, NY (US)

(72) Inventors: Shigeru Nakagawa, Kawasaki (JP); Hidetoshi Numata, Kawasaki (JP); Yoichi Taira, Tokyo (JP)

(73) Assignee: International Business Machines Corporation, Armonk, NY (US)

( * ) Notice: Subject to any disclaimer, the term of this patent is extended or adjusted under 35 U.S.C. 154(b) by 194 days.

(21) Appl. No.: 14/748,306

(22) Filed: Jun. 24, 2015

(65) Prior Publication Data

US 2015/0293305 A1    Oct. 15, 2015

Related U.S. Application Data

(63) Continuation of application No. 14/657,232, filed on Mar. 13, 2015, now Pat. No. 9,429,711.

(30) Foreign Application Priority Data

Mar. 26, 2014    (JP) ................................. 2014-064218

(51) Int. Cl.
*G02B 6/32* (2006.01)
*G02B 6/42* (2006.01)
(Continued)

(52) U.S. Cl.
CPC .............. *G02B 6/32* (2013.01); *G02B 3/0006* (2013.01); *G02B 6/125* (2013.01); *G02B 6/421* (2013.01);
(Continued)

(58) Field of Classification Search
CPC .. C07D 249/04; C07D 249/06; C07D 401/10; C07D 401/12; C07D 401/14;
(Continued)

(56) References Cited

U.S. PATENT DOCUMENTS 5,802,711 A * 9/1998 Card .................... B23K 1/0056
                                                     228/180.1
6,973,248 B2    12/2005 Kropp
(Continued)

FOREIGN PATENT DOCUMENTS

JP    2001185752 A    7/2001
JP    2004191564 A    7/2004
(Continued)

OTHER PUBLICATIONS

List of IBM Patents or Patent Applications Treated as Related; JP920140016US2, Date Filed: Jun. 24, 2015, pp. 1-2.
(Continued)

*Primary Examiner* — Minh Trinh
(74) *Attorney, Agent, or Firm* — Jared C. Chaney

(57) ABSTRACT

An optical device includes a substrate including a waveguide array formed therein, each waveguide having a reflective surface; a lens array unit including a waveguide-side lens array arranged facing the waveguide array so each lens of the lens array is aligned with the corresponding reflective surface; and a connector unit including an optical transmission path-side lens array arranged and fixed so each lens of the lens array is aligned with the corresponding lens in the waveguide-side lens array, the plurality of inserted optical transmission paths aligned with the corresponding lens in the optical transmission path-side lens array.

8 Claims, 18 Drawing Sheets

(51) Int. Cl.
- *G02B 3/00* (2006.01)
- *G02B 6/125* (2006.01)
- *G02B 6/12* (2006.01)
- *G03F 7/00* (2006.01)
- *G02B 6/38* (2006.01)

(52) U.S. Cl.
CPC .......... *G02B 6/425* (2013.01); *G02B 6/4212* (2013.01); *G02B 6/4214* (2013.01); *G02B 6/4292* (2013.01); *G02B 6/3853* (2013.01); *G02B 6/3885* (2013.01); *G02B 2006/12147* (2013.01); *G02B 2006/12173* (2013.01); *G03F 7/0005* (2013.01); *Y10T 29/49826* (2015.01)

(58) Field of Classification Search
CPC .. C07D 403/10; C07D 403/12; C07D 403/14; C07D 405/10
See application file for complete search history.

(56) References Cited

U.S. PATENT DOCUMENTS

| | | |
|---|---|---|
| 7,421,160 B1 | 9/2008 | Budd et al. |
| 8,837,878 B2 | 9/2014 | Chen et al. |
| 9,429,711 B2 | 8/2016 | Nakagawa et al. |
| 2003/0174964 A1 | 9/2003 | Gao et al. |
| 2004/0033016 A1 | 2/2004 | Kropp |
| 2004/0191565 A1 | 9/2004 | Takahashi |
| 2006/0023990 A1 | 2/2006 | Shih et al. |
| 2011/0026878 A1 | 2/2011 | Matsuoka et al. |
| 2011/0222821 A1* | 9/2011 | Pitwon ................. G02B 6/3897 385/92 |
| 2015/0003780 A1 | 1/2015 | Taira |
| 2015/0355409 A1 | 12/2015 | Yanagisawa |

FOREIGN PATENT DOCUMENTS

| | | |
|---|---|---|
| JP | 2004191565 A | 7/2004 |
| JP | 2005037870 A | 2/2005 |
| JP | 2005195991 A | 7/2005 |
| JP | 2008502013 A | 1/2008 |
| JP | 2008145684 A | 6/2008 |
| JP | 2008216905 A | 9/2008 |
| JP | 2013020027 A | 1/2013 |
| JP | 2014085415 A | 5/2014 |
| JP | 2015114431 A | 6/2015 |
| WO | 2010098171 A1 | 9/2010 |
| WO | 2012023430 A1 | 2/2012 |

OTHER PUBLICATIONS

Shigeru Nakagawa, et al.,"Optical Device, Optical Connector Assembly, and Optical Connecting Method," U.S. Appl. No. 14/657,232, filed Mar. 13, 2015.

Notification of Reasons for Refusal, Patent Application No. 2014-064218, dated Apr. 26, 2016, 8 pages.

Decision to Grant a Patent, Patent Application No. 2014-064218, dated Sep. 9, 2016, 5 pages.

Nakagawa et al., "Optical Device, Optical Connector Assembly, and Optical Connecting Method", Japan Application No. 2014-064218, filed Mar. 26, 2014, 49 pages.

* cited by examiner

OPTICAL CONNECTING METHOD

DOMESTIC AND FOREIGN PRIORITY

This application is a continuation of U.S. Pat. No. 9,429,711, filed Mar. 13, 2015, which claims priority to Japanese Patent Application No. 2014-064218, filed Mar. 26, 2014, and all the benefits accruing therefrom under 35 U.S.C. § 119, the contents of which in its entirety are herein incorporated by reference.

BACKGROUND

The present invention relates to an optical device having a waveguide provided on a substrate and, more specifically, to an optical device able to connect the waveguide on the substrate to an external optical transmission path, and also an optical connector assembly and optical connection method for connecting a waveguide on a substrate to an external optical transmission path.

There is growing demand for optical interconnect technologies with faster speeds and reduced power consumption. In order to realize both faster speeds and reduced power consumption, photoelectric conversion units with faster speeds and reduced power consumption are being developed along with optical multichip modules (optical MCMs) in which optical signal input/output units have been provided near semiconductor circuit chips on a mounting substrate.

The optical interconnections in these optical MCMs have to be connected to an external optical interconnection circuit via optical transmission paths such as optic fibers with low loss. In the prior art, a technique has been used in which optic fibers are connected to waveguides on a substrate via optical connectors on the side surface of the optical MCM substrate. FIGS. 18(A) and 18(B) are diagrams showing an optical MCM and optic fiber connecting structure of the prior art. FIG. 18(A) is a side view, and FIG. 18(B) is a top view.

In the optical MCM 500 shown in FIGS. 18(A) and 18(B), optical waveguide layers 510 is formed on the surface of an optical substrate 502 from the end of the board to a location near a mounted semiconductor chip 520. A 45° mirror 512 is formed in the waveguide layer 510 to deflect light passing through the core upwards or deflect light from above into the core. A vertical cavity surface emitting laser (VCSEL) 528 is provided on the transmitting end, and a photodiode (PD) 526 is provided on the receiving end in a position corresponding to a mirror 512 in the waveguide layers 510, and these components are fixed using an underfill 516.

A transimpedance amplifier/limiting amplifier (TIA/LIA) 522 for amplifying electrical signals from the PD 526, and a laser diode driver (LDD) 524 for driving the VCSEL 528 are provided on an inorganic substrate 502. The TIA/LIA 522, LDD 524, PD 526 and VCSEL 528 are connected by way of vias 514 to electrical wiring 506 formed in the organic substrate 502. An optical connector 540 is provided on an end surface of the optical substrate 502, and a fiber ribbon 530 and waveguide layer 510 are connected via the optical connector 540.

Another optical interconnector technology related to optic fibers and waveguides has been disclosed in Laid-open Patent Publication No. 2004-191565. An optical path conversion connector is disclosed which includes bundled optic fibers and waveguides or photoelectric conversion elements arranged one-dimensionally or two-dimensionally, and establishes an optical connection with an external component with a positioned member.

SUMMARY

In one embodiment, an optical device includes a substrate including a waveguide array formed therein, each waveguide having a reflective surface; a lens array unit including a waveguide-side lens array arranged facing the waveguide array so each lens of the lens array is aligned with the corresponding reflective surface; and a connector unit including an optical transmission path-side lens array arranged and fixed so each lens of the lens array is aligned with the corresponding lens in the waveguide-side lens array, the plurality of inserted optical transmission paths aligned with the corresponding lens in the optical transmission path-side lens array.

In another embodiment, an optical connector assembly includes a lens array unit including a waveguide-side lens array arranged facing a waveguide array on a substrate, each waveguide having a reflective surface, so each lens of the lens array is aligned with the corresponding reflective surface; and a connector unit including an optical transmission path-side lens array arranged and fixed so each lens of the lens array is aligned with the corresponding lens in the waveguide-side lens array, and the plurality of inserted optical transmission paths are aligned with the corresponding lens in the optical transmission path-side lens array; the lens array unit having a lens array-side portion in the bottom surface aligned with respect to the substrate and including an alignment mechanism for aligning each lens of the waveguide-side lens array with the corresponding reflective surface.

In another embodiment, a method of forming an optical device includes preparing a substrate including a waveguide array formed therein, each waveguide having a reflective surface; arranging a lens array unit including a waveguide-side lens array including a lens array facing the waveguide array so each of the lenses in the waveguide-side lens array is aligned with the corresponding reflective surface; and attaching a connector unit to the lens array unit, the connector unit including an optical transmission path-side lens array provided with a plurality of lenses and aligned and fixed so a plurality of optical transmission paths are inserted and aligned with the corresponding lenses in the optical transmission path-side lens array, and the connector unit being aligned with the lens array unit so each lens in the optical transmission path-side lens array is aligned with a lens in the waveguide-side array.

DETAILED DESCRIPTION

Figure 18A:
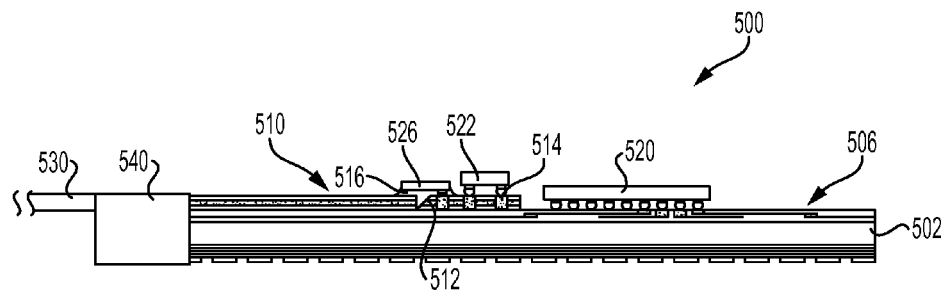
FIGS. 18(A) and 18(B) are diagrams showing the connection structure between optic fibers and an optical multichip module of the prior art.
Figure 18B:
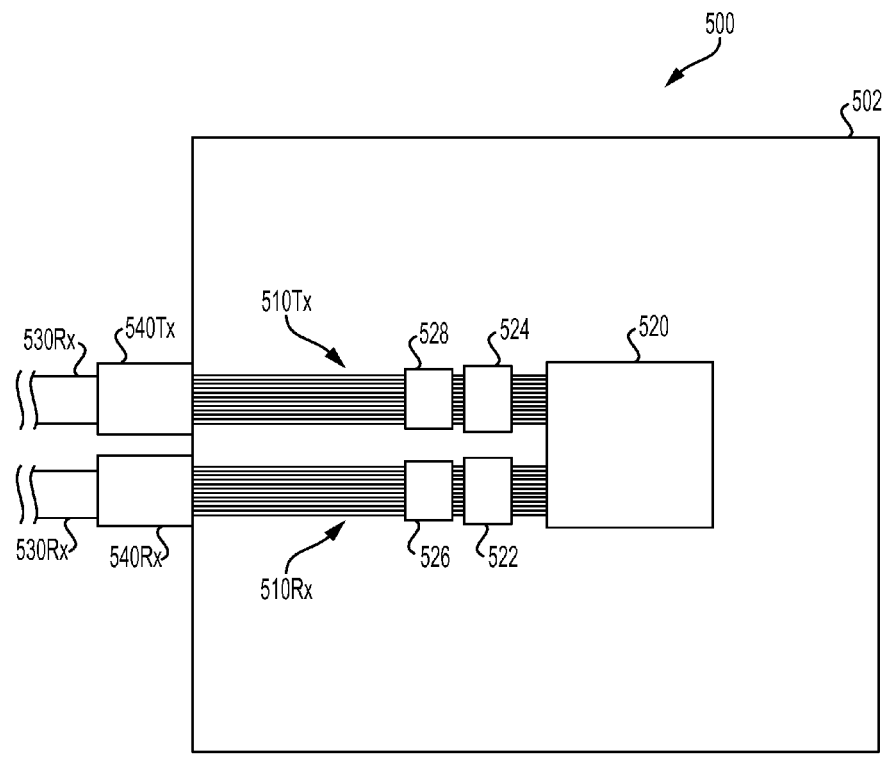

Demand is growing for even higher bandwidth and the number of channels is increasing, but it is difficult to increase the number of channels in the optical connector of the prior art shown in FIGS. 18(A) and 18(B), since the optic fibers are connected to a side surface of the organic substrate 502. This is because, in a structure with side surface connections to the substrate, there are constraints on the thickness of the substrate, the area that can be used to establish connections is limited, and the optical connection structure is fairly large. There is also a desire for more relaxed alignment tolerances in optical connectors in order to realize low loss optical connections. Even the optical path conversion connector disclosed in Patent Literature 1 cannot sufficiently accommodate increases in bandwidth and the number of channels.

In view of these deficiencies in the prior art technology, embodiments of the present invention provide an optical device, optical connector assembly, and optical connection method which are able to relax spatial constraints on and alignment tolerances in optical connection structures in which a waveguide array formed on a substrate connects to external optical transmission paths.

In order to solve these problems, embodiments of the present invention provide an optical device with the following characteristics. The optical device includes a substrate including a waveguide array formed therein, each waveguide having a reflective surface, a lens array unit, and a connector unit. The lens array unit includes a waveguide-side lens array arranged facing the waveguide array such that each lens of the lens array is aligned with the corresponding reflective surface. The connector unit includes an optical transmission path-side lens array arranged and fixed such that each lens of the lens array is aligned with the corresponding lens in the waveguide-side lens array, and the plurality of inserted optical transmission paths are aligned with the corresponding lens in the optical transmission path-side lens array.

Embodiments of the present invention can also provide an optical connector assembly including a lens array unit provided with the waveguide-side lens array described above, and a connector unit provided with an optical transmission path-side lens array and arranged and fixed such that each of the plurality of inserted optical transmission paths is aligned with the corresponding lens in the optical transmission path-side lens array. The lens array unit has a lens array-side portion in the bottom surface aligned with respect to the substrate and including an alignment mechanism for aligning each lens of the waveguide-side lens array with the corresponding reflective surface.

Embodiments of the present invention can also provide an optical connection method with the following characteristics. This optical connection method includes: preparing a substrate including a waveguide array formed therein, each waveguide having a reflective surface; arranging a lens array unit including a waveguide-side lens array provided with a plurality of lenses facing the waveguide array so each of the lenses in the waveguide-side lens array is aligned with the corresponding reflective surface; and attaching a connector unit to the lens array unit, the connector unit including an optical transmission path-side lens array provided with a plurality of lenses and aligned and fixed so a plurality of optical transmission paths are inserted and aligned with the corresponding lens in the optical transmission path-side lens array, and the connector unit being aligned with the lens array unit so each lens in the optical transmission path-side lens array is aligned with a lens in the waveguide-side array.

The configuration(s) described above relax spatial constraints on and alignment tolerances in optical connection structures in which a waveguide array formed on a substrate connects to external optical transmission paths.

The following is an explanation of an embodiment of the present invention with reference to the appended drawings. The present invention is not limited to the embodiment shown in the appended drawings. Note that the appended drawings may not be to scale.

First Embodiment

The following is an explanation of examples of an optical multichip module 100 and an optical connector assembly 132 used in the optical device and optical connector assembly in the first embodiment of the present invention.

Figure 1A:
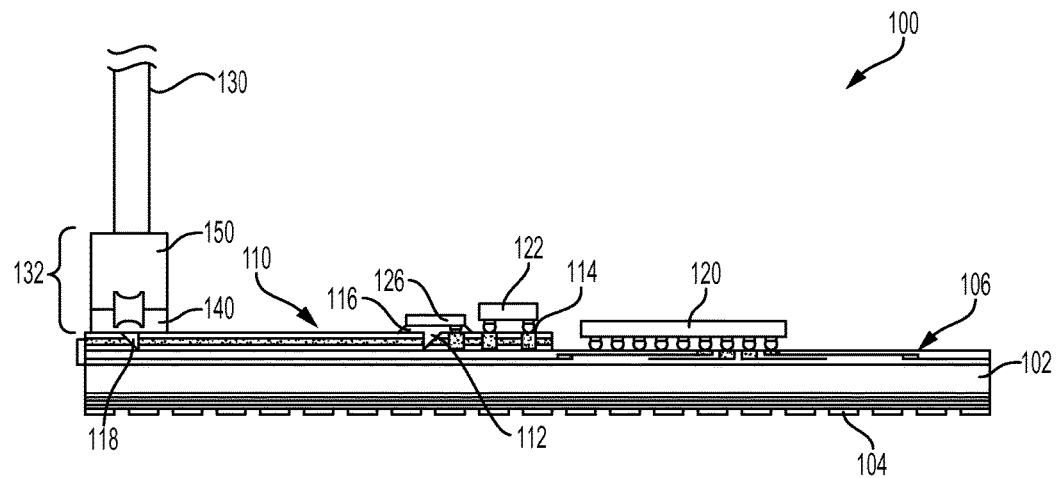
FIGS. 1(A) and 1(B) are diagrams schematically illustrating the structure of the optical multichip module and the connection structure between the optical multichip module and optic fibers in a first embodiment of the present invention.
Figure 1B:
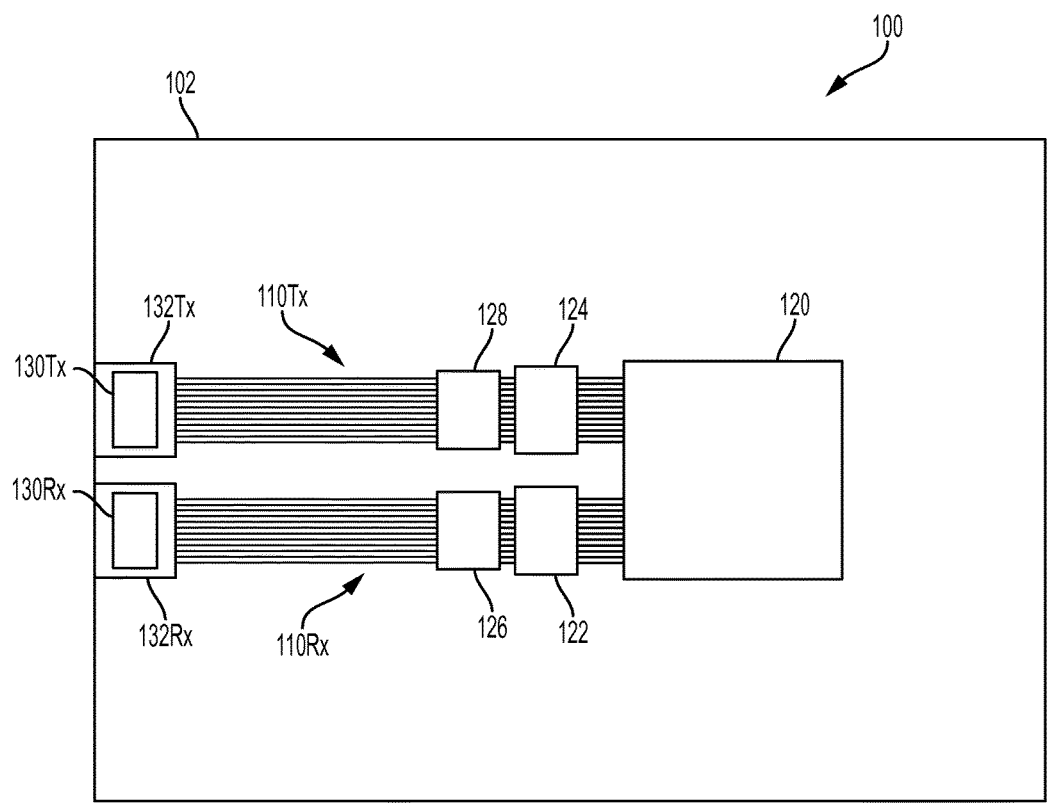

FIGS. 1(A) and 1(B) are diagrams schematically illustrating the structure of the optical multichip module (optical MCM) 100 and the connection structure between the optical MCM 100 and optic fibers 130 in the first embodiment of the present invention. FIG. 1(A) is a side view, and FIG. 1(B) is a top view.

In the optical MCM 100, one or more semiconductor chips 120 with electrical logic circuits are provided on top of a substrate 102. Waveguide layers 110 are formed on the surface of the substrate 102 so as to extend to a position near a semiconductor chip 120. The waveguide layers 110 include a waveguide array arranged one-dimensionally or two-dimensionally. The waveguide layers 110 are provided to transmit optical signals to a location as close as possible to a semiconductor chip 120 in order to shorten the transmission distance of electrical signals on the mounting substrate. This is because electrical signals become distorted and are lost as heat when the modulation frequency of the signals is high.

The waveguide layers 110 are usually formed as polymer waveguides. The various types of resins used as core materials and cladding materials in the waveguide layers 110 include polyimide resins, polyetherimide resins, polycarbonate resins, polyamide resins, silicone resins, polyurethane resins, acrylate-based resins, polysiloxane-based resins, phenolic resins, and polyquinoline resins.

The photoelectric conversion between the optical signals transmitted over the waveguides and the electrical signals used by the semiconductor chip 120 is performed by a photodiode (PD) 126 and a vertical cavity surface emitting laser (VCSEL) 128. At one end of each waveguide in a waveguide layer 110, a reflective surface 112 with a 45° incline is formed, and a PD 126 and VCSEL 128 are provided at the reflective surface 112 of the waveguide and are fixed using an underfill 116. The reflective surface 112 deflects light travelling over the waveguide towards the light-receiving region of the PD 126, and deflects light emitted from the VCSEL 128 so as to be incident on the waveguide.

Electrical signals from the PD 126 are amplified by a TIA/LIA 122. The VCSEL 128 is driven by an LDD 124. The TIA/LIA 122, LDD 124, PD 126, and VCSEL 128 are connected by way of vias 114 to several layers of electrical wiring 106 formed on the substrate 102. An electric input-output unit 104 is provided on the back side of the substrate 102, and the optical MCM 100 is connected electrically to a motherboard (not shown).

At the other end of each waveguide in a waveguide layer 110, a reflective surface 118 with a 45° incline is formed to deflect the waveguide in the vertical direction with respect to the substrate. An optical connector assembly 132 is provided at the reflective surfaces 118 of the waveguide layers 110 on the upper surface of the substrate 102.

The optical MCM 100 in the present embodiment of the present invention is characterized by the attachment of an optical connector assembly 132 to the upper surface of the substrate to establish an optical connection between the waveguide layers 110 formed on the surface of the substrate 102 and an optic fiber ribbon 130. The optical connector assembly 132 in the first embodiment includes a substrate-side component 140 positioned and installed facing the region with the reflective surfaces 118 on the substrate 102, and a fiber connector 150 in which an optic fiber ribbon 130 has been inserted and fixed, and which has been attached to the substrate-side component 140. Both of these units have a microlens array, and an upper access-type connector structure. In other words, both the substrate-side component 140 and the fiber connector 150 include the microlens array and connector unit of the first embodiment.

The microlens array in the substrate-side component 140 includes a plurality of microlenses. The substrate-side component 140 is positioned and installed on the substrate 102 so that each microlens is aligned with the reflective surface formed in each waveguide. The microlens array in the fiber connector 150 includes a similar array of microlenses. The fiber connector 150 is mounted so that each microlens is aligned with a microlens in the substrate-side component 140.

Because the optic fibers are connected to the top surface of the substrate from above in the optical MCM 100 in the first embodiment of the present invention, spatial constraints are more relaxed compared to situations in which optic fibers are connected to the side surface of a substrate. At the same time, by coupling waveguides to optic fibers via both microlens arrays, the alignment tolerance between waveguides and optic fibers can also be relaxed.

Figure 2A:
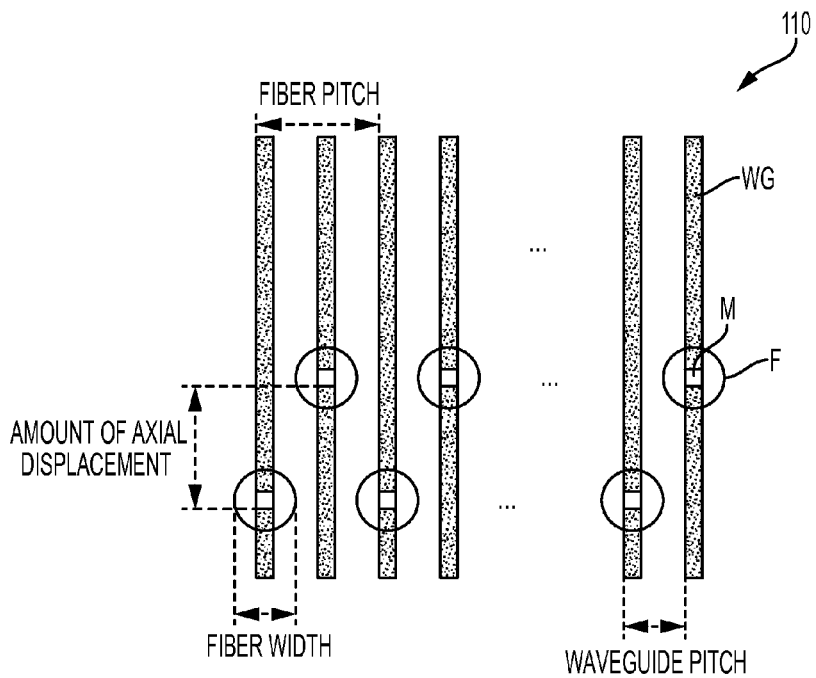
FIGS. 2(A) and 2(B) are diagram showing waveguides formed on a substrate to which the optical connector assembly in the first embodiment is to be attached.

The following is a more detailed description of an optical connection structure using the optical connector assembly 132 in the first embodiment of the present invention, with reference to FIG. 2(A) through FIG. 6. FIGS. 2(A) and 2(B) are top views showing the waveguide layer 110 formed on a substrate 102 to which the optical connector assembly 132 in the first embodiment of the present invention is attached. FIG. 2(A) shows the waveguides when the microlens array has two rows of lenses, and FIG. 2(B) shows the waveguides when the microlens array has four rows of lenses. First, an embodiment with two rows of microlenses and reflective surfaces in the waveguides will be explained with reference to FIG. 2(A) and FIG. 3(A) through FIG. 6.

In the embodiment explained here, as shown in FIG. 2(A), a waveguide array WG is arranged in the horizontal direction on the substrate in the waveguide layer 110. A reflective surface M with a 45° incline is formed in each waveguide WG. Optic fibers F are aligned with the reflective surfaces M.

In standard specifications such as 1000 BASE-SX and LX, the cladding diameter of the optic fibers is approximately 125 µm, and the core diameter is approximately 50 µm or 62.5 µm in the case of multimode fibers and approximately 9.2 µm in the case of single mode fibers. The pitch of the optic fibers F is usually 250 µm in the standard specifications. Typically, the core of the waveguides is 30-50 µm$^2$ in multimode and 2-8 µm$^2$ in single mode waveguides.

The waveguide WG can have dimensions that are smaller than those of the optic fibers F, but the size of optic fibers is established by the standard specifications. In a structure in which optic fibers are connected to the substrate-side surface, the formation of waveguides at a pitch distance narrower than optic fibers is difficult because of spatial constraints, and this is an obstacle to increasing the number of channels and achieving greater density.

Figure 2B:
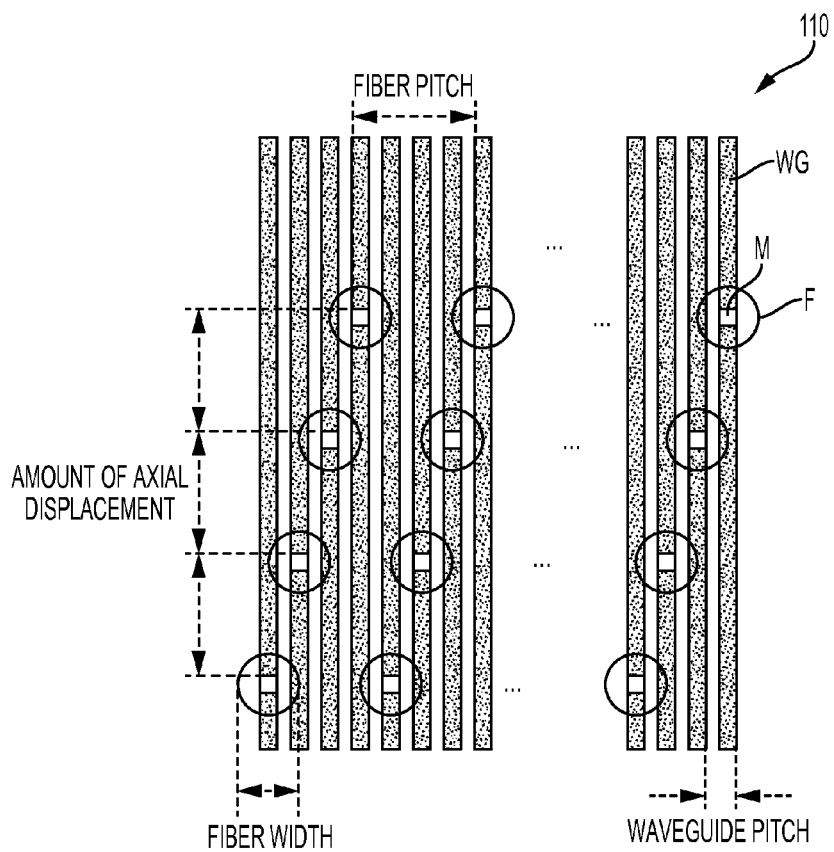

The optical connection structure in the present embodiment is an upper access-type structure as described above, which is able to make full use of the wider substrate surface. In this structure, as shown in FIGS. 2(A) and 2(B), the reflective surfaces M in each waveguide WG are arranged in a plurality of rows by displacing adjacent waveguides in the axial direction. The microlens array is also formed in a plurality of rows corresponding to the array of reflective surfaces M.

In the embodiment shown in FIG. 2(A), the reflective surfaces M are formed in staggered positions in the waveguide WG array to form two rows. The amount of displacement in the axial direction of the waveguide WG is typically a distance that does not cause the rows in the fiber ribbon and microlenses to overlap.

By arranging the reflective surfaces M in staggered positions in a plurality of rows, the standards for the fiber optic pitch can be met in each row, while also creating a pitch distance between adjacent waveguides that is narrowed to a length equal to the pitch distance between optic fibers divided by the number of rows. Thus, the waveguides can be mounted more densely than waveguides arranged in a single row on an end surface and connected to fibers. For example, if the fiber pitch is established at 250 μm according to standards, the pitch of the reflective surfaces arranged in two rows can be reduced to 125 μm.

In the embodiment explained here, the waveguides WG were arranged in a single row in the horizontal direction of the substrate for simplicity of explanation. However, the array of waveguides WG is not limited to this. In another embodiment, the waveguides may be arranged two-dimensionally in the vertical direction of the substrate by laminating polymer waveguides on each other.

Figure 3A:
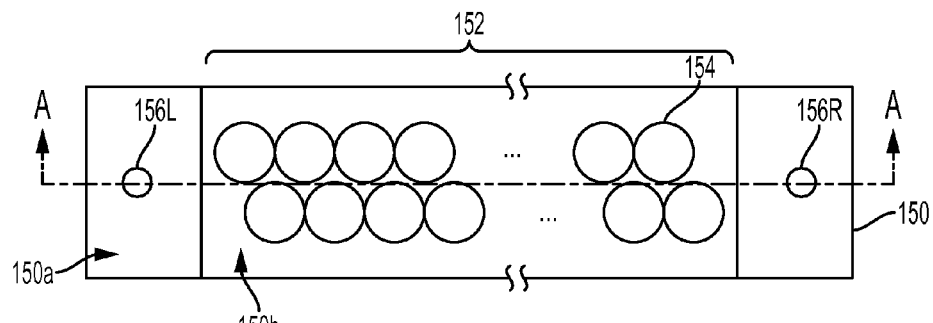
FIGS. 3(A), 3(B) and 3(C) are diagrams showing the optical connector assembly in the first embodiment.
Figure 3B:
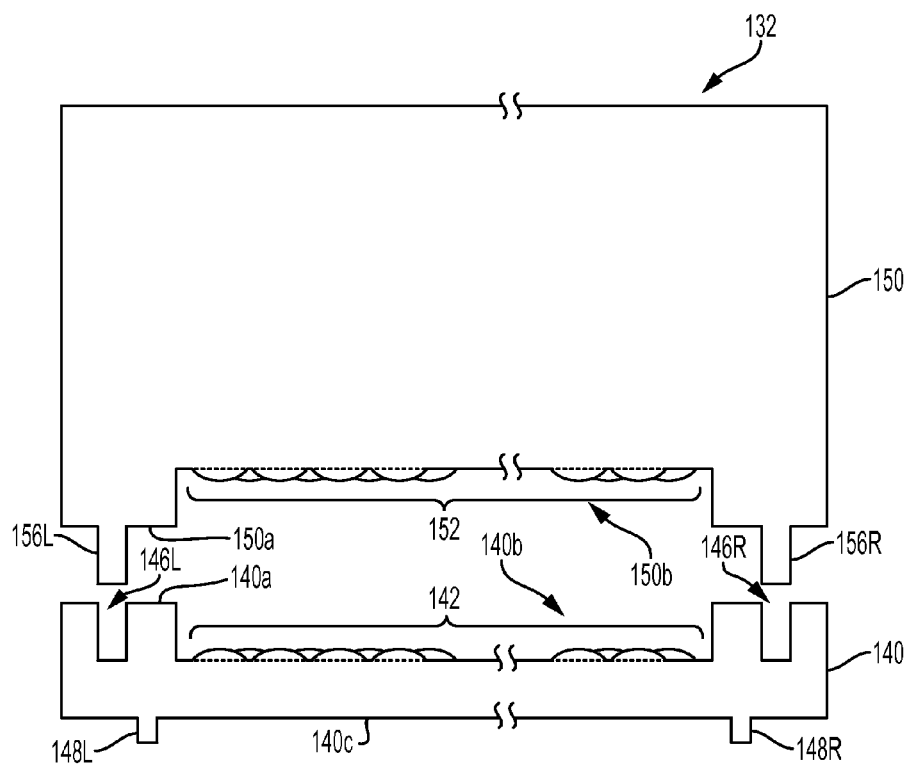
Figure 3C:
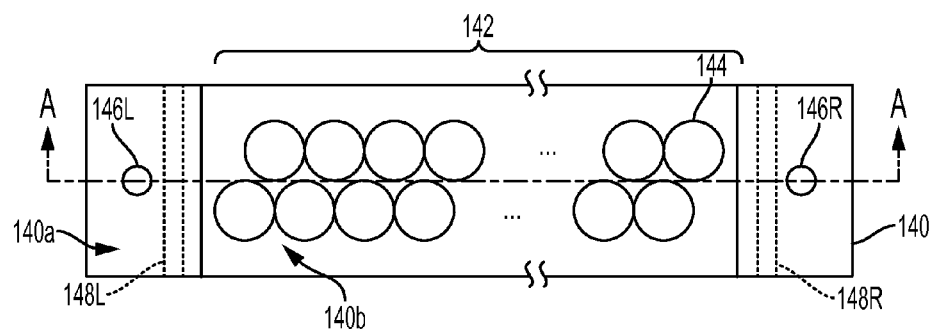

FIGS. 3(A)-3(C) are diagrams showing the optical connector assembly 132 in the first embodiment of the present invention. FIG. 3(A) is a bottom view of the fiber connector 150 on the top end constituting the optic connector assembly 132. FIG. 3 (C) is a top view of the substrate-side component 140 constituting the optical connector assembly 132. FIG. 3(B) is a side view of the fiber connector 150 and the substrate-side component 140. FIG. 3(B) is a cross-sectional view of the fiber connector 150 and the substrate-side component 140 cut away in the center (indicated by arrows A-A in FIG. 3(A) and FIG. 3(C)). This is done to schematically illustrate the microlenses 144, 154 provided longitudinally in the center.

The fiber connector 150 shown in FIG. 3 includes a microlens array 152 in which microlenses 154 are arranged in two rows corresponding to the two-dimensional array of reflective surfaces M described above. The substrate-side component 140 also includes a microlens array 142 in which the microlenses 144 are arranged in two rows corresponding to the two-dimensional array of reflective surfaces M described above. The microlens array in the fiber connector 150 refers to the microlens array 152 on the fiber side, and the microlens array in the substrate-side component 140 refers to the microlens array 142 on the waveguide side.

The microlens array 152 on the fiber side is formed in recesses 150*b* provided in the bottom surface 150*a* of the fiber connector 150. The microlens array 142 on the waveguide side is formed in recesses 140*b* provided in the top surface 140*a* of the substrate-side component 140. While not shown in the drawing, an optic fiber ribbon 130 is inserted into the fiber connector 150 from above, and each end surface is aligned with and fixed to the corresponding microlens 154 in the fiber-side microlens array 152.

In a preferred embodiment, the substrate-side component 140 and the fiber connector 150 include an alignment mechanism for aligning the fiber-side microlens array 152 with the waveguide-side microlens array 142.

In the embodiment explained here, a portion of the alignment mechanism on the fiber connector 150 side is a pair of rod-shaped studs 156L, 156R formed on both ends of the fiber-side microlens array 152 in the bottom surface 150*a* of the fiber connector 150. The rod-shaped studs 156L, 156R can be round columns or polygonal columns.

A portion of the alignment mechanism on the substrate-side connector 140 side is a pair of holes or grooves 146L, 146R formed on both ends of the waveguide-side microlens array 142 in the top surface 140*a* of the substrate-side connector 140 in which the rod-shaped studs 156L, 156R are fitted. The holes can be spaces passing through to the other side, and the grooves can be recesses that do not pass through to the other side. Both are interchangeable in the present embodiment.

Figure 4A:
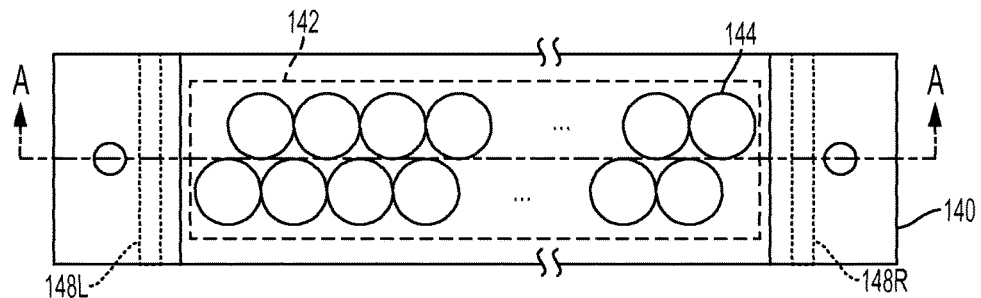
FIGS. 4(A), 4(B) and 4(C) are diagrams showing the structure of the substrate corresponding to the optical connector assembly in the first embodiment.
Figure 4B:
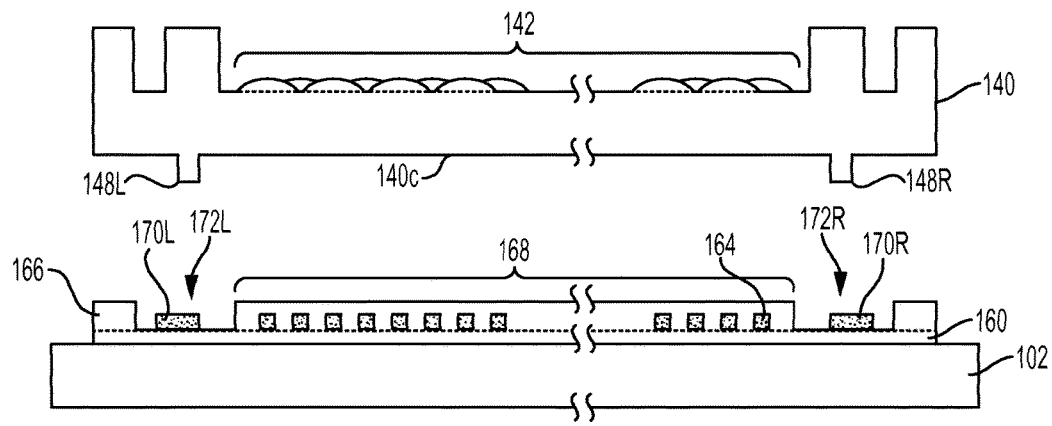
Figure 4C:
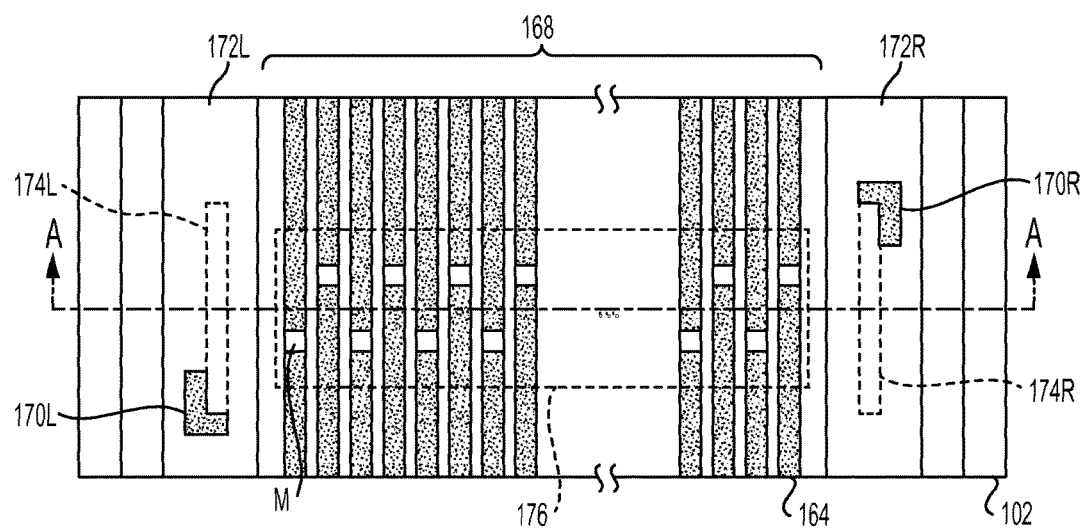

FIGS. 4(A)-4(C) are diagrams showing the structure of the substrate 102 corresponding to the optical connector assembly 132 in the first embodiment of the present invention. FIG. 4(A) is a top view of the substrate-side component 140, and FIG. 4(C) is a top view of the substrate 102. FIG. 4(B) is a side view of the substrate-side component 140 and the substrate 102. FIG. 4(B) is a cross-sectional view of the substrate-side component 140 and the substrate 102 cut away in the center (indicated by arrows A-A). This is done to schematically illustrate the microlenses 144 and dummy core 170 (explained below) provided longitudinally in the center. In FIG. 4(A) the structure provided on the bottom surface 140*c* of the substrate-side component 140 is indicated by the dotted lines.

The substrate-side component 140 and the substrate 102 in the first embodiment of the present invention also include an alignment mechanism for aligning each microlens 144 in the waveguide-side microlens array 142 with the reflective surface M in a waveguide in a waveguide layer 110. In the embodiment explained here, as shown in FIG. 4, a portion of the alignment mechanism in the substrate-side component 140 is a pair of slender rectangular studs 148L, 148R formed on the bottom surface 140*c* at both ends of the region corresponding to the portion in which the waveguide-side microlens array 142 has been formed.

A portion of the alignment mechanism in the substrate 102 is a set of positioning members 170L, 170R provided on both ends of the region including the arrangement of reflective surfaces 176 in the arrangement of waveguides 168 in order to receive and stop the pair of slender rectangular studs 148L, 148R.

As shown in FIG. 4(B) and FIG. 4(C), a plurality of cores 164 is formed on the lower cladding layer 160 of the substrate 102, and each core 164 is covered by the upper cladding layer 166. The array 168 of waveguides includes the lower cladding layer 160, the cores 164 and the upper cladding layer 166. The array 176 of reflective surfaces M with a 45° incline are also formed in the array 168 of waveguides.

The upper cladding layer 166 is removed from both sides of the region in which the array 168 of waveguides has been formed, and grooves 172L, 172R are created. The lower cladding layer 160 and the dummy cores 170L, 170R are also exposed. The dummy cores 170L, 170R use the core material and are patterned at the same time as the waveguide cores 164. These are formed to improve positioning accuracy with respect to the cores 164. As a result, the dummy cores 170L, 170R provide good reference points in the horizontal and vertical directions when the microlens array 142 is aligned with the reflective surfaces M of the waveguide cores 164.

The dummy cores 170L, 170R shown in FIG. 4(C) are both L-shaped. In the first embodiment, the two L-shaped cores 170L, 170R have a diagonal relationship and constitute the set of positioning members mentioned above. The dashed lines 174L, 174R in FIG. 4(C) indicate the positions on the lower cladding layer 160 on which the pair of slender rectangular studs 148L, 148R are to be positioned. The pair of dummy cores 170L, 170R receives and stops the rectangular studs 148L, 148R arranged in these positions, and secures them so that the rectangular studs 148L, 148R do not become misaligned in the horizontal direction of the substrate.

Figure 5:
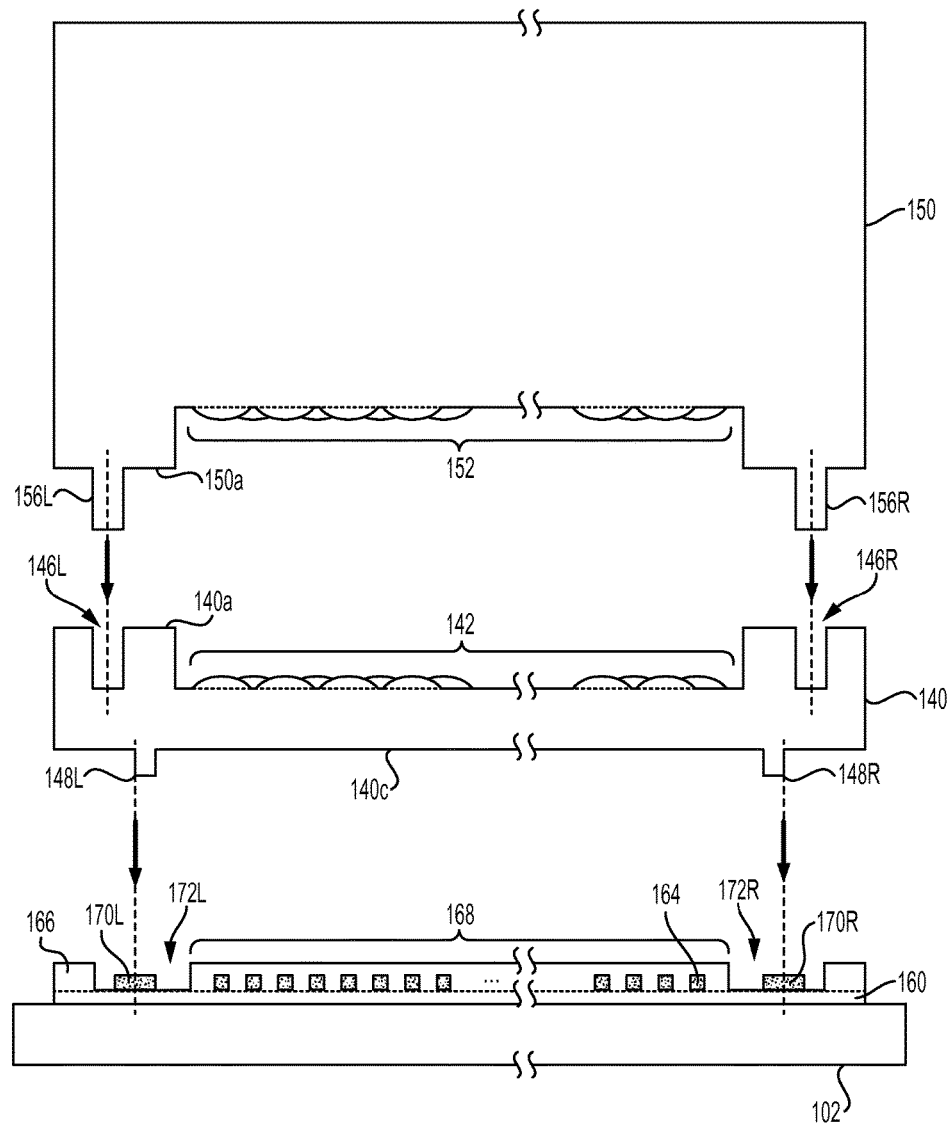
FIG. 5 is a diagram used to explain the optical connection method used to attach the optical connector assembly in the first embodiment to the substrate (1/2).
Figure 6:
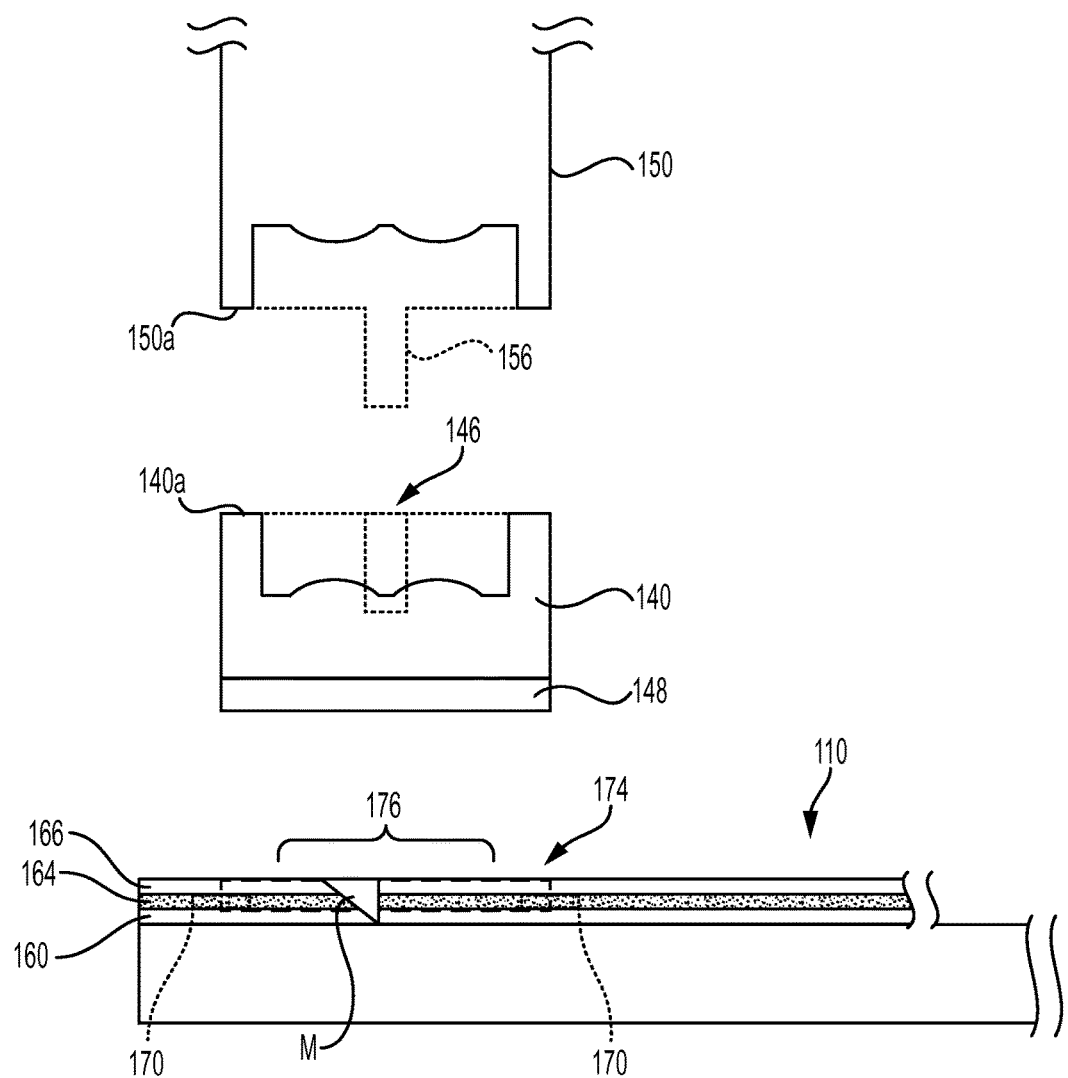
FIG. 6 is a diagram used to explain the optical connection method used to attach the optical connector assembly in the first embodiment to the substrate (2/2).

FIG. 5 and FIG. 6 are diagrams used to explain the optical connection method used to attach the optical connector assembly 132 in the first embodiment of the present invention to a substrate 102. FIG. 5 is a top view, and FIG. 6 is a side view. FIG. 6 depicts a reflective surface M corresponding to a row of microlenses on the left, the location at which the pair of rectangular studs 148 are positioned is indicated by dashed line 174, and the location of the dummy core 170 is indicated by dotted lines. The alignment mechanisms 146, 156 between the substrate-side component 140 and the fiber connector 150 are also indicated by dotted lines.

In the first step of the optical connection method using an optical connector assembly 132, a substrate 102 is prepared in which waveguide cores 164 with reflective surfaces M have been formed. In the second step, a substrate-side component 140 including a waveguide-side microlens array 142 is arranged on and attached to the substrate 102. Each portion of the alignment mechanism described above is formed on the substrate 102 and the substrate-side component 140. The arrangement of the substrate-side component 140 on the substrate 102 includes aligning the pair of rectangular studs 148L, 148R provided on the bottom surface 140c of the substrate-side component 140 with respect to the pair of dummy cores 170L, 170R in the substrate 102.

When the substrate-side component 140 is attached to the substrate 102, the pair of rectangular studs 148L, 148R are received and stopped by the pair of L-shaped dummy cores 170L, 170R on the substrate 102, and the bottom comes into contact with the upper surface of the lower cladding layer 160. In this way, each microlens 144 in the waveguide-side microlens array 142 is aligned horizontally and remains parallel to the reflective surface M of the corresponding waveguide WG. At this time, the periphery of the dummy cores 170L, 170R and the upper surface of the waveguide layer 110 are typically coated with an adhesive, and the substrate-side component 140 is bonded to the substrate 102.

In the third step, the fiber connector 150 with an optic fiber ribbon 130 inserted and fixed is attached to the substrate-side component 140. When the fiber connector 150 is attached to the substrate-side component 140, the pair of rod-shaped studs 156L, 156R are fitted into the pair of holes or grooves 146L, 146R until the bottom surface 150a of the fiber connector 150 comes into contact with the top surface 140a of the substrate-side component 140. In this way, each microlens 154 in the fiber-side microlens array 152 is aligned horizontally and remains parallel to the corresponding microlens 144 in the waveguide-side microlens array 142. The rod-shaped studs 156L, 156R and the holes or grooves 146L, 146R are typically removably inserted.

By using the configuration described above, the alignment tolerance between the waveguides WG and the optic fibers F can be relaxed by a factor of ten compared to a situation in which the waveguides WG and the optic fiber F are directly aligned with each other. The substrate-side component 140 is arranged on and fixed to the substrate 102 including waveguides WG in the designed positioned, and the fiber connector 150 is attached to the substrate-side component 140. In this way, the simple, low-loss connection of waveguides WG and optic fibers F can be realized.

Referring to FIGS. 7(A)-7(E), the following is an explanation of the method used to form, along with the waveguides, dummy cores to serve as the substrate-side aligning members in the alignment mechanism of a preferred embodiment. FIG. 7 is a diagram used to explain the method used to form a waveguide core and dummy core in a preferred embodiment. FIGS. 7(A) through (E) are cross-sectional views of each step in the method.

Figure 7A:
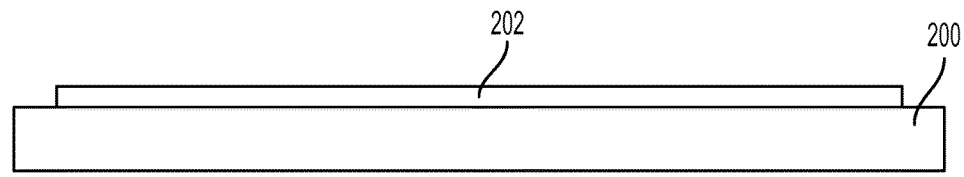
FIGS. 7(A), 7(B), 7(C), 7(D), and 7(E) are diagrams used to explain the method used to form a waveguide core and dummy core in a preferred embodiment.
Figure 7B:
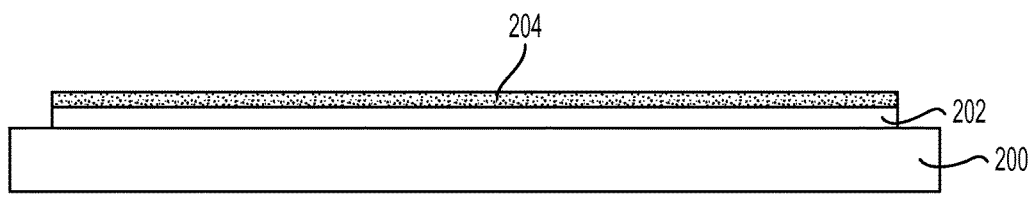
Figure 7C:
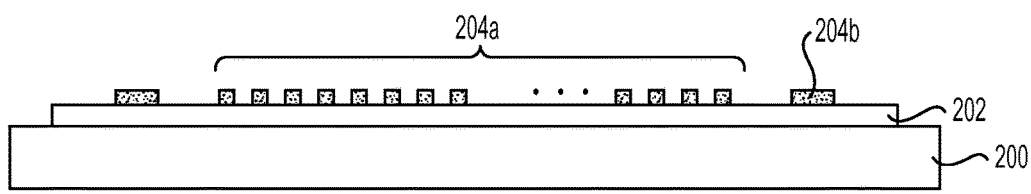

In the waveguide and dummy core forming method shown in FIGS. 7(A)-7(E), a lower cladding layer 202 is formed on the substrate 200 in the first step (FIG. 7(A)). In the second step, a core layer 204 is applied on top of the upper cladding layer 202 on the substrate 200 (FIG. 7(B)). In the third step, photolithography is used to pattern the core layer 204, and form the waveguide core array 204a and the L-shaped dummy core 204b on top of the lower cladding layer 202 (FIG. 7(C)). The waveguide core array 204a and the L-shaped dummy core 204b are formed using the same mask pattern.

Figure 7D:
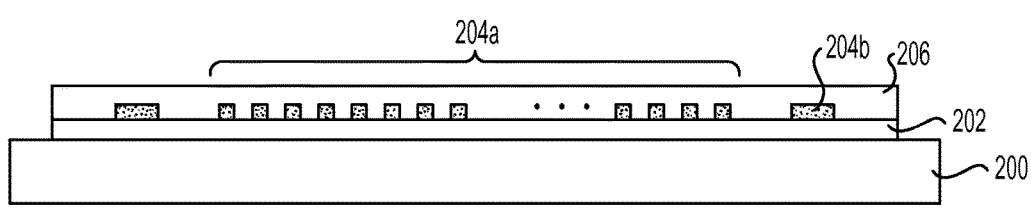
Figure 7E:
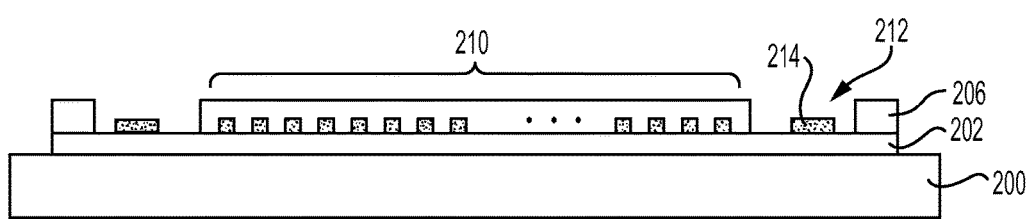

In the fourth step, the upper cladding layer 206 is applied so as to cover the core layer 204 (FIG. 7(D)). In the fifth step, photolithography is used to pattern the upper cladding layer 206 to expose the dummy core 214 and the lower cladding layer 202 with a groove 212 on the periphery of the dummy core 214, and an upper cladding layer 206 is formed which covers the patterned waveguide core array 210 (FIG. 7(E)).

In one embodiment, the dummy core 214 is formed as a structure which is patterned in the same step as the waveguide core array 210 using the same mask. In this way, the dummy core 214 provides a high-precision reference point in the horizontal and vertical directions with respect to the waveguide core array 210. Formation of the waveguide core array 210 and the dummy core 214 in separate steps is not prohibited, but the simultaneous creation of these components in the same step is able to effectively prevent deterioration in alignment precision caused by overlapping mask patterns. The core layer is usually made of a polymer material that can be patterned with greater precision than the cladding layers. The dummy core 214 can be created with a high degree of dimensional precision using photolithography.

There are no particular restrictions on the method used to pattern the core. Examples include the direct exposure method in which a photomask is applied to the core layer and then exposed and developed to form a patterned core layer, the reactive ion etching (RIE) method in which a photoresist pattern is formed on the core layer using photolithography and etched using RIE to form a patterned core layer, and the duplication method in which a core shape is duplicated on a cladding layer using a core-shaped mold and the core shape is filled with a core material to form a patterned core layer.

Reflective surfaces M with a 45° incline can be formed in the waveguides WG by cutting an end surface perpendicular to the optical axis of the core and the surface of the substrate and then a reflective surface M at a 45° angle using dicing or laser processing. A gold or aluminum mask can also be deposited on the reflective surface M. There are no particular restrictions on the method used to form the reflective surfaces M. Any method common in the art can be used.

There are no particular restrictions on the method used to create the fiber connector 150 and substrate-side component 140 described above. In a preferred embodiment, these components can be integrally formed with a high degree of dimensional precision by transferring a mold imprint to a polymer. There are no particular restrictions on the material used in the fiber connector 150 and the substrate-side component 140. Any optically transparent polymer material can be used. For example, the waveguide layers explained above can be created using resins such as polyimide resins, polyetherimide resins, and polycarbonate resins.

The following is an explanation with reference to FIGS. 8(A)-8(D) and FIGS. 9(A)-9(C) of another embodiment of a structure for a substrate 102 on which an optical connector assembly 132 is attached.

In the first embodiment described above, as shown in FIGS. 4(A)-4(C), one portion constituting the alignment mechanism of the substrate 102 is the pair of L-shaped dummy cores 170L, 170R formed to receive and stop corners of the pair of the slender rectangular studs 148L, 148R. These L-shaped dummy cores 170L, 170R are formed on four corners including two outer corners of each of the rectangular studs 148L, 148R to receive and stop one of the two pairs of diagonal corners composed of two corners on the same diagonal line. However, the shape of the positioning members shown in FIGS. 4(A)-4(C) is for illustrative purposes only, and the present invention is not restricted to this shape.

In one embodiment, a portion of the alignment unit formed on the substrate 102 side can be formed to receive and stop at least the two outer or inner side surfaces of the four longer side surfaces in the pair of rectangular studs 148, one of the shorter side surfaces of the pair of rectangular studs, and the shorter side surface opposite this. The set of positioning members includes a rectangular groove for engaging the rectangular studs, an L-shaped member for receiving and stopping one corner of the rectangular studs, a squared-off C-shaped member for receiving and stopping two corners of the rectangular studs, or any combination of these.

FIGS. 8(A)-8(D) and FIGS. 9(A)-9(C) are diagrams showing another structure for a substrate 102 to which the optical connector assembly 132 in the first embodiment of the present invention can be attached.

Figure 8A:
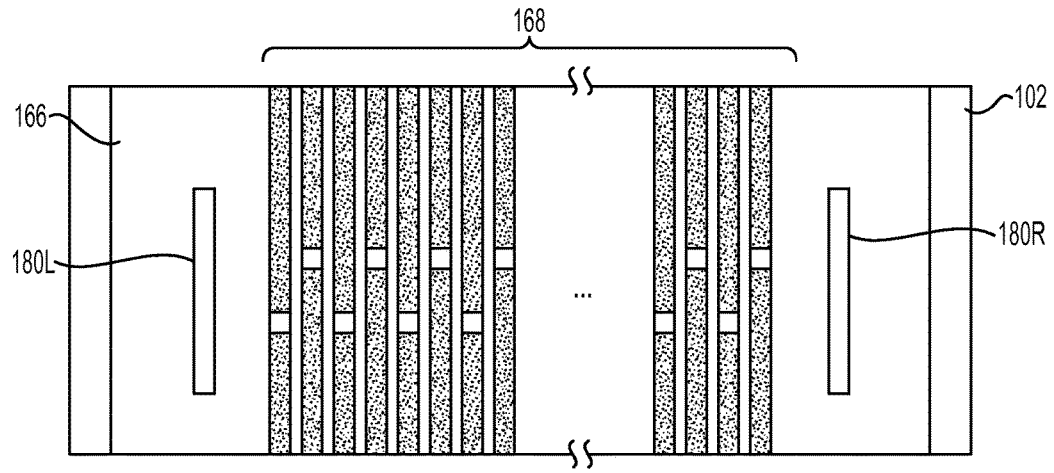
FIGS. 8(A), 8(B), 8(C), and 8(D), are diagrams showing another structure for a substrate to which the optical connector assembly in the first embodiment can be attached.
Figure 8B:
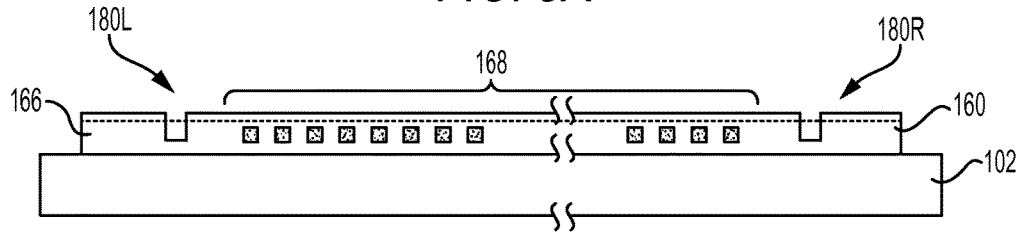
Figure 8C:
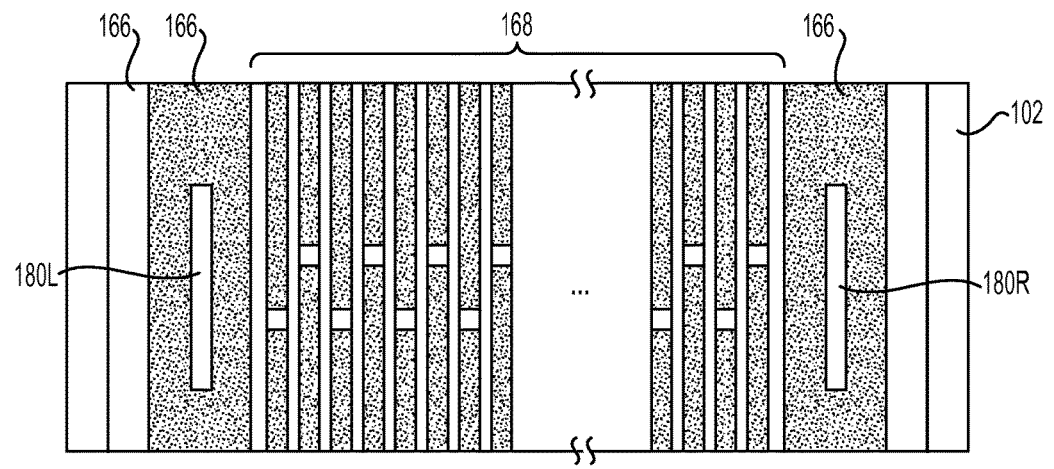
Figure 8D:
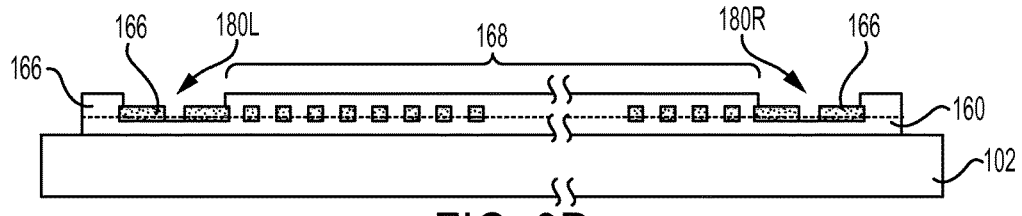

FIG. 8(A) and FIG. 8(B) show a substrate in which grooves 180L, 180R have been formed in the upper cladding layer 166 instead of L-shaped dummy cores 170L, 170R. These grooves 180L, 180R are formed with dimensions into which the pair of slender rectangular studs 148R, 148L just fit. These grooves 180L, 180R may be formed using photolithography or laser processing. FIG. 8(C) and FIG. 8(D) show grooves 180L, 180R that have been formed using the core material and photolithography into which the rectangular studs 148R, 148L fit.

In the embodiment shown in FIGS. 8(A)-8(D), when the substrate-side component 140 is attached to the substrate 102, the pair of slender rectangular studs 148L, 148R is fitted into the pair of grooves 180L, 180R on the substrate 102. The side surface of each rectangular stud 148 is received and stopped by the corresponding side surface in a groove 180, and the bottom surface of the rectangular stud 148 comes into contact with the upper surface of the lower cladding layer 160, which forms the bottom surface of the groove 180. In this way, the waveguide-side microlens array 152 is aligned with the reflective surface of the corresponding waveguide in both the horizontal and vertical directions. In the embodiment shown in FIG. 8(C) and FIG. 8(D), the grooves 180L, 180R are formed at the same time as the waveguide cores using the core material. Therefore, as in the case of the first embodiment, the grooves can be formed with a high degree of precision and aligned with the waveguide cores with a high degree of precision.

Figure 9A:
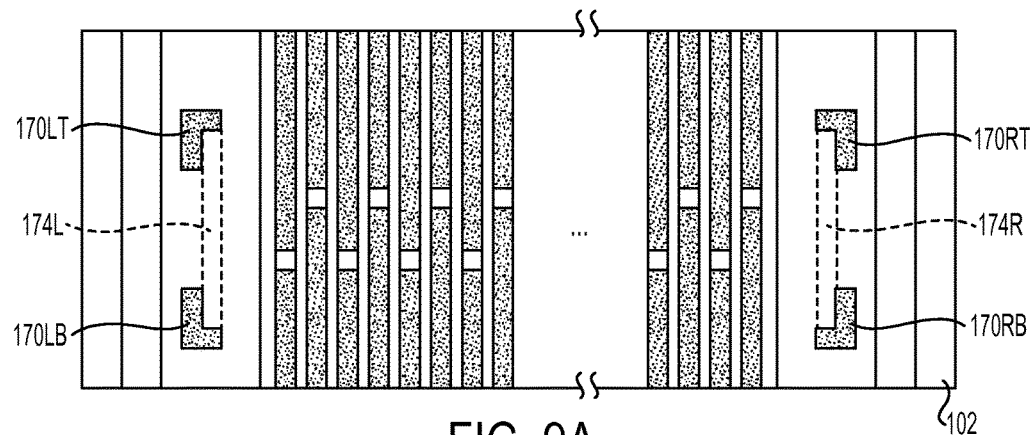
FIGS. 9(A), 9(B) and 9(C) are diagrams showing yet another structure for a substrate to which the optical connector assembly in the first embodiment can be attached.
Figure 9B:
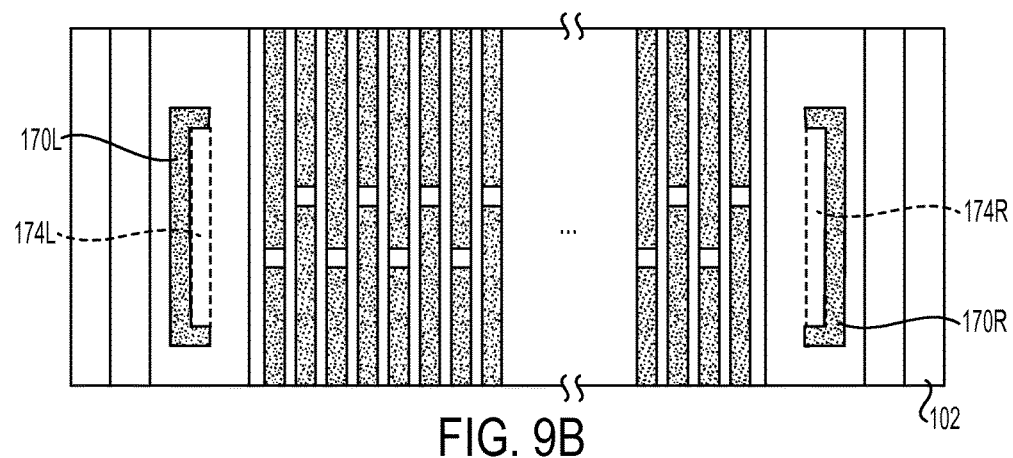
Figure 9C:
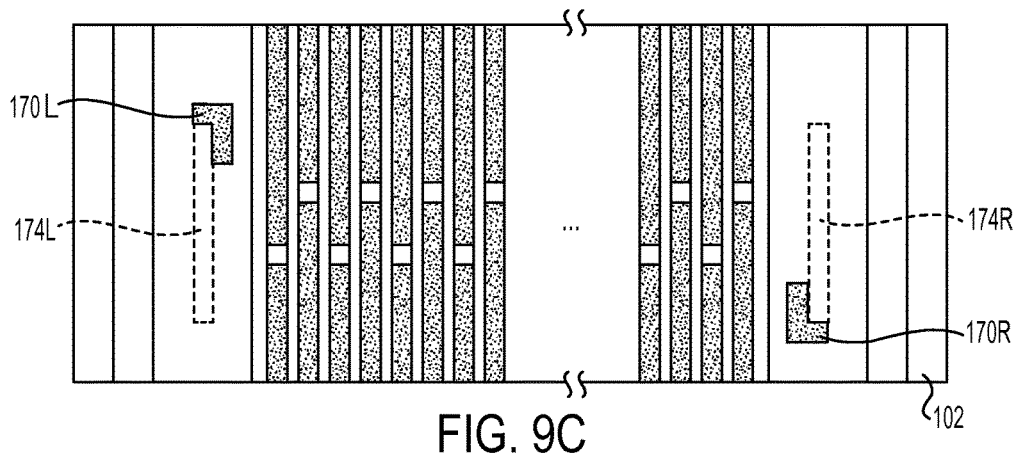

In the embodiment shown in FIG. 9(A), four L-shaped dummy cores 170LT, 170LB, 170RT, 170RB are formed. These four L-shaped dummy cores 170 receive and stop the four outer corners, two corners each, of the pair of rectangular studs 148L, 148R. In the embodiment shown in FIG. 9(B), a pair of squared-off, C-shaped dummy cores 170 are formed to receive and stop the side surfaces other than the opposing side surfaces of the pair of rectangular studs 148. In the embodiment shown in FIG. 9(C), a pair of L-shaped dummy cores 170L, 170R are formed to receive and stop the four inner corners of the pair of rectangular dummy studs 148.

By forming a set of positioning members in the waveguide layer 110 to restrict the movement of the pair of rectangular studs 148 on the substrate in the horizontal direction, the substrate-side component 140 can be arranged properly on the substrate 102.

Figure 10:
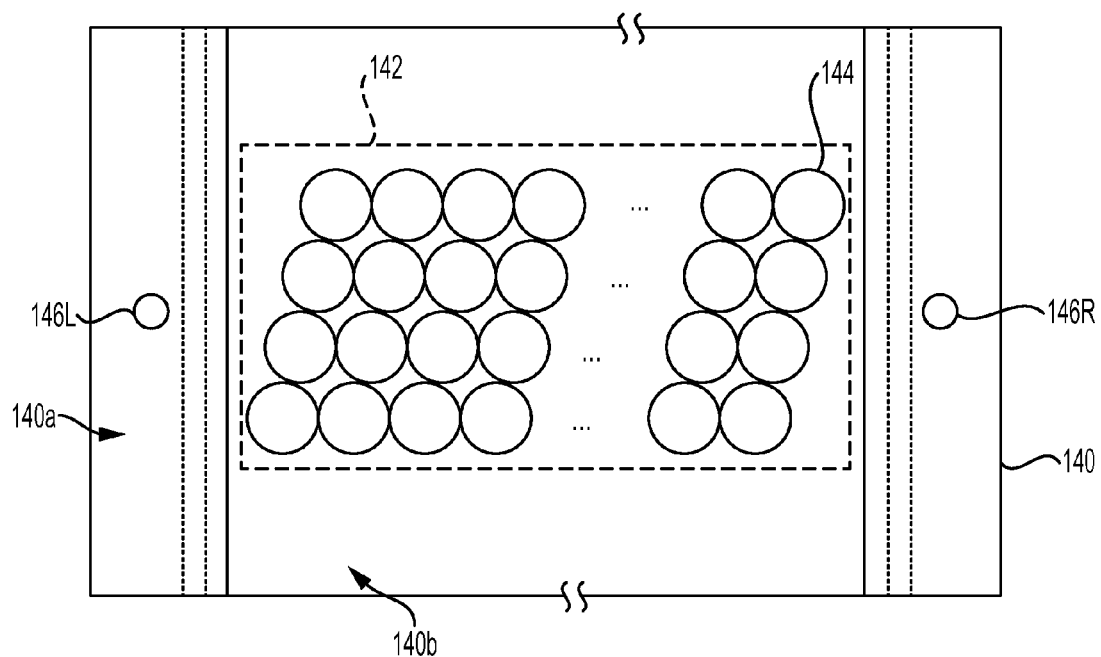
FIG. 10 is a top view showing a substrate-side component in which lenses have been arranged in four rows.

The following is an explanation of a connection structure using a microlens array in which the lenses are arranged in four rows with reference to FIG. 2(B) and FIG. 10. FIG. 2(B) is a top view of the waveguides when a microlens array with four rows of lenses is used, and FIG. 10 is a top view of a substrate-side component 140 with four rows of lenses.

In the embodiment shown in FIG. 2(B), the reflective surfaces M are formed in the four rows in staggered positions in adjacent waveguides, with four waveguides in the waveguide array forming a single unit. The substrate-side component 140 shown in FIG. 10 includes a microlens array 142 with staggered lenses 144 in four rows corresponding to the two-dimensional array of reflective surfaces M described above. The fiber connector 150 also includes a microlens array 152 with staggered microlenses 154 in four rows corresponding to the two-dimensional array of reflective surfaces M described above.

As explained with reference to FIGS. 2(A) and 2(B), FIGS. 9(A)-9(C), and FIG. 10, as the number of staggered reflective surfaces and microlens arrays increases, pitch distance between adjacent waveguides can be narrowed to a length equal to the pitch distance between optic fibers divided by the number of rows, and preferably to a size smaller than the outer diameter of the fibers.

The following is an explanation of a method used to fix the optical connector assembly 132 in the first embodiment of the present invention to a substrate 102 with reference to FIG. 11 through FIG. 15.

Figure 11:
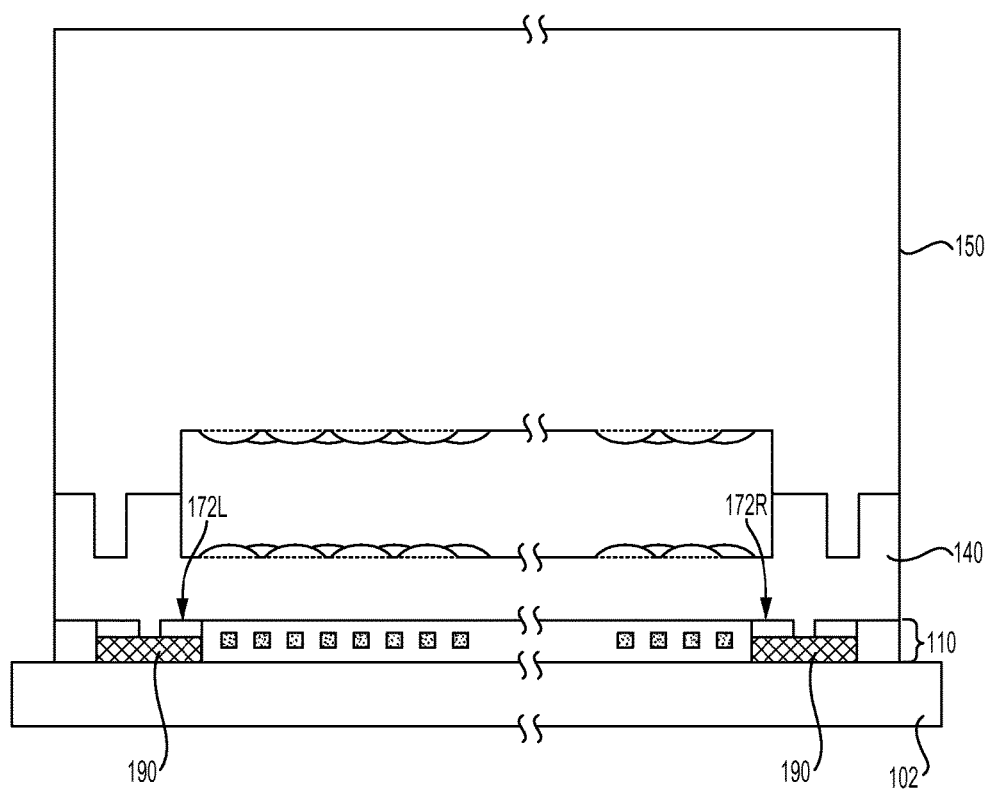
FIG. 11 is a diagram showing a simple method for fixing the optical connector assembly to a substrate.

FIG. 11 is a diagram showing a simple method for fixing the optical connector assembly 132 to a substrate 102. In the waveguide layer 110 of the substrate 102, as explained above, grooves 172L, 172R exposing the lower cladding layer 160 and the dummy cores 170L, 170R are formed in the upper cladding layer 166. In the fixing method shown in FIG. 11, a photocurable adhesive 190 is first applied around the spots 174L, 174R in the grooves 172L, 172R in which the rectangular studs 148 are arranged. At least the substrate-side component 140 in the optical connector assembly 132 is formed of a material that is transparent to light of a predetermined wavelength for curing the photocurable adhesive.

After installing the substrate-side component 140 on the waveguide component 110, curing light is directed towards the substrate-side component 140 from above to cure the photocurable adhesive 190. In this way, the substrate-side component 140 constituting the optical connector assembly 132 is fixed to the substrate 102. The fiber connector 150 on which the optical fiber ribbon 130 has been fixed is then fitted into the substrate-side component 140 to complete the optical connection.

Figure 12A:
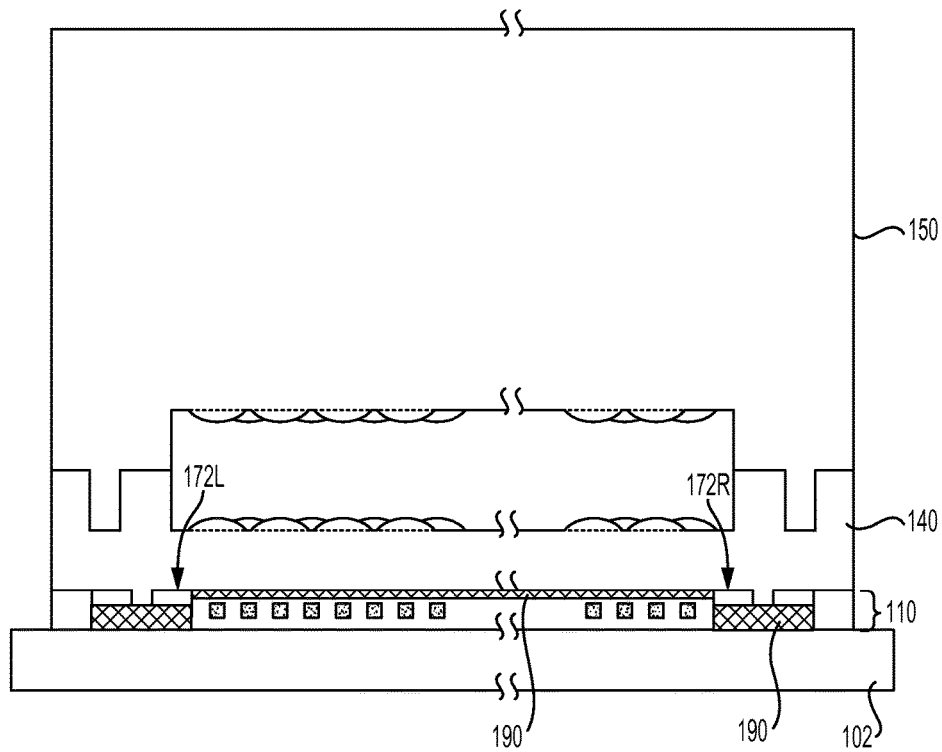
FIGS. 12(A) and 12(B) are diagrams showing an improved method for fixing the optical connector assembly to a substrate.
Figure 12B:
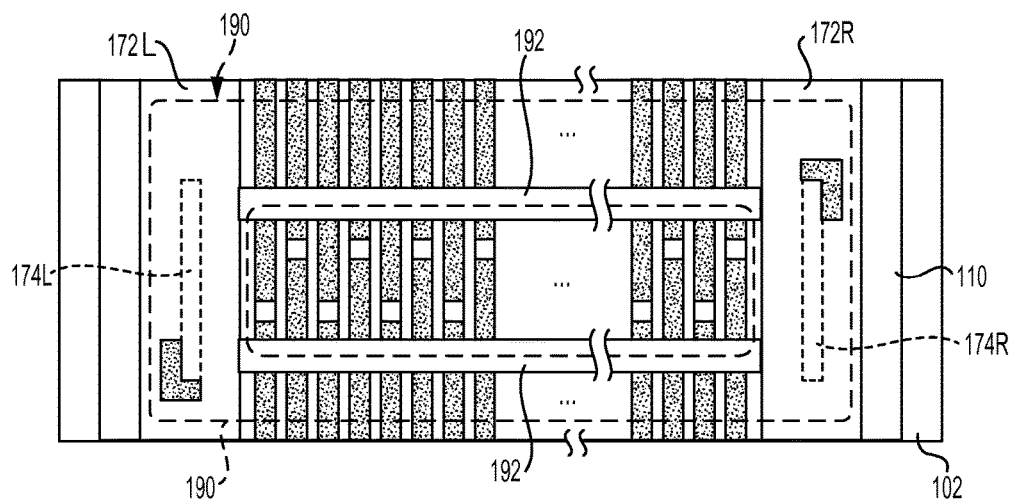

FIGS. 12(A) and 12(B) are diagrams showing an improved method for fixing the optical connector assembly 132 to a substrate 102. In the improved fixing method shown in FIGS. 12(A) and 12(B), a recess 192 is formed in the surface of the upper cladding layer 166 of the waveguide layers 110 on the substrate 102 across the portion with the array 176 of reflective surfaces M.

Figure 13A:
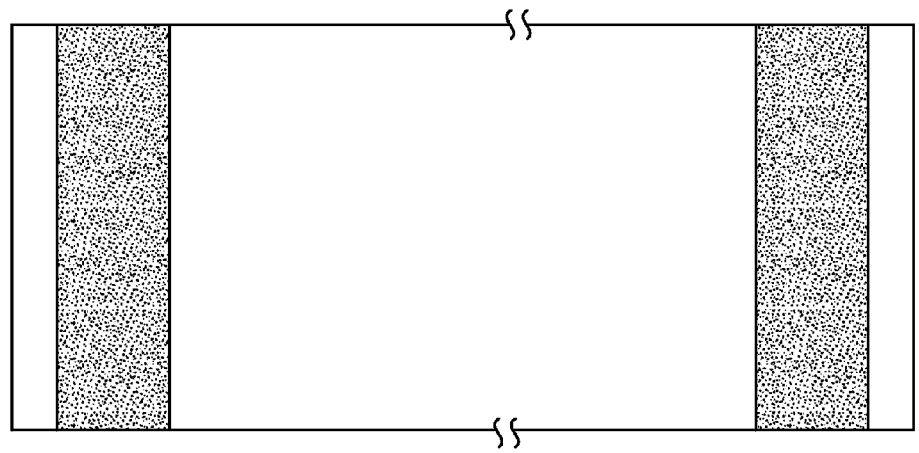
FIGS. 13(A) and 13(B) are diagrams showing two types of mask pattern used to form grooves and recesses that can be employed in the improved fixing method shown in FIG. 12.
Figure 13B:
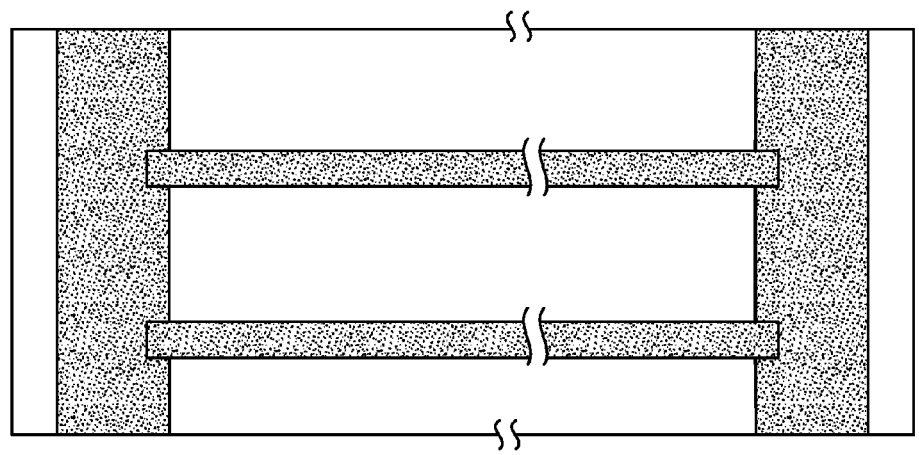

The recess 192 can be formed by making a shallow cut in the surface of the upper cladding layer 166 of the waveguide layers 110. When the upper cladding layer 166 of the waveguide layers 110 is formed, two masks can also be used to pattern the two layers as shown in FIG. 13(A) and FIG. 13(B). The first pattern shown in FIG. 13(A) defines the groove 172, and the second mask pattern defines the groove 172 and the recess 192.

In the improved fixing method shown in FIGS. 12(A) and 12(B), the substrate-side component 140 is installed on the substrate 102, and then a photocurable adhesive is applied to the surface of the waveguide layers 110 including the portion with the grooves 172. At this time, the recess 192 keeps the adhesive applied to the surface of the waveguide layers 110 from flowing into the space with the 45° micromirrors formed in the waveguide layers 110.

The fixing method shown in FIGS. 12(A) and 12(B) can ensure a larger bonding area than a situation in which the adhesive is only applied to the portion with the grooves 172 as shown in FIG. 11, and can improve resistance to the tensile force applied to the optic fiber ribbon 130. There is usually a difference in the thermal expansion coefficients of the waveguide layers 110 formed on top of a substrate 102 made of organic materials, and the substrate-side component 140. As shown in FIGS. 12(A) and 12(B), thermal displacement caused by this difference in thermal expansion coefficients can be prevented by bonding the bottom surface of the substrate-side component 140 more to the surface with the waveguide layers 110 over a wider area.

Figure 14A:
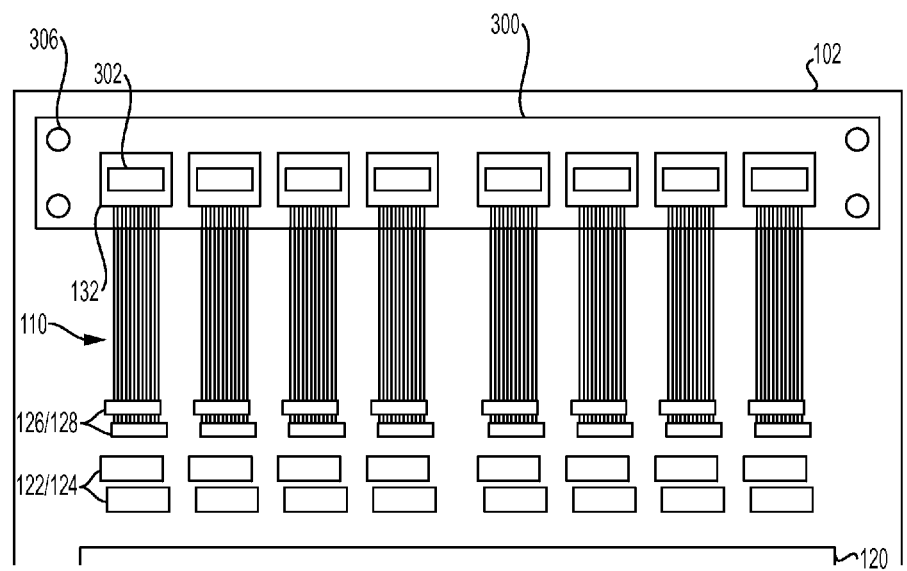
FIGS. 14(A) and 14(B) are diagrams showing a fixture used to fix a fiber connector constituting the optical connector assembly to a substrate.
Figure 14B:
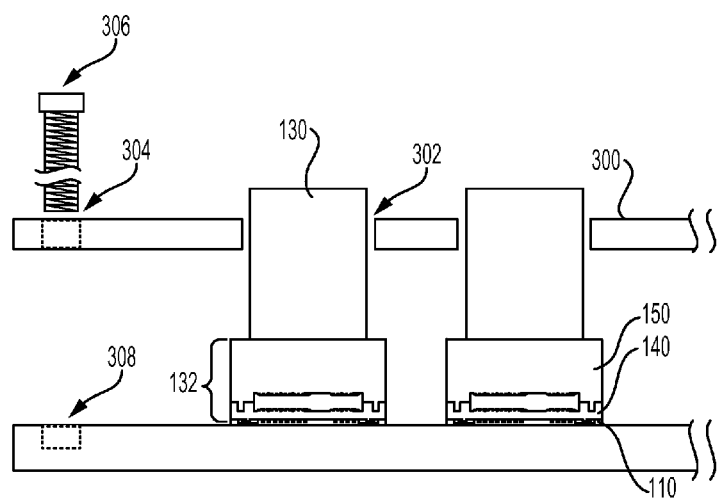

FIGS. 14(A) and 14(B) are diagrams showing a fixture 300 used to fix a fiber connector 150 constituting the optical connector assembly 132 to a substrate 102. FIG. 14(A) shows a top view of the substrate 102, and FIG. 14(B) shows a side view of the substrate 102, the optical connector assembly 132, and the fixture 300. FIG. 14(B) is a cross-sectional view cut away in the center of the opening 302 in which the optic fiber ribbon 130 is inserted. This is done to schematically illustrate the fastening holes 304, 308 and the fastening member 306 in the fixture 300 provided longitudinally in the center.

The fixture 300 shown in FIGS. 14(A) and 14(B) has an opening 302 in which the fiber ribbon 130 of each optical connector assembly 132 is inserted, and a fastening hole 304 through which a fastening member such as a screw is passed. The opening 302 in the fixture 300 is used to fix the optical connector assembly 132 between the upper surface of the substrate 102 and the bottom surface of the fixture 300 by inserting the optical fiber ribbon 130, and passing a fastening member 306 such as a screw through the fastening hole 304 and screwing it into the fastening hole 308 on the substrate 102 side.

Figure 15:
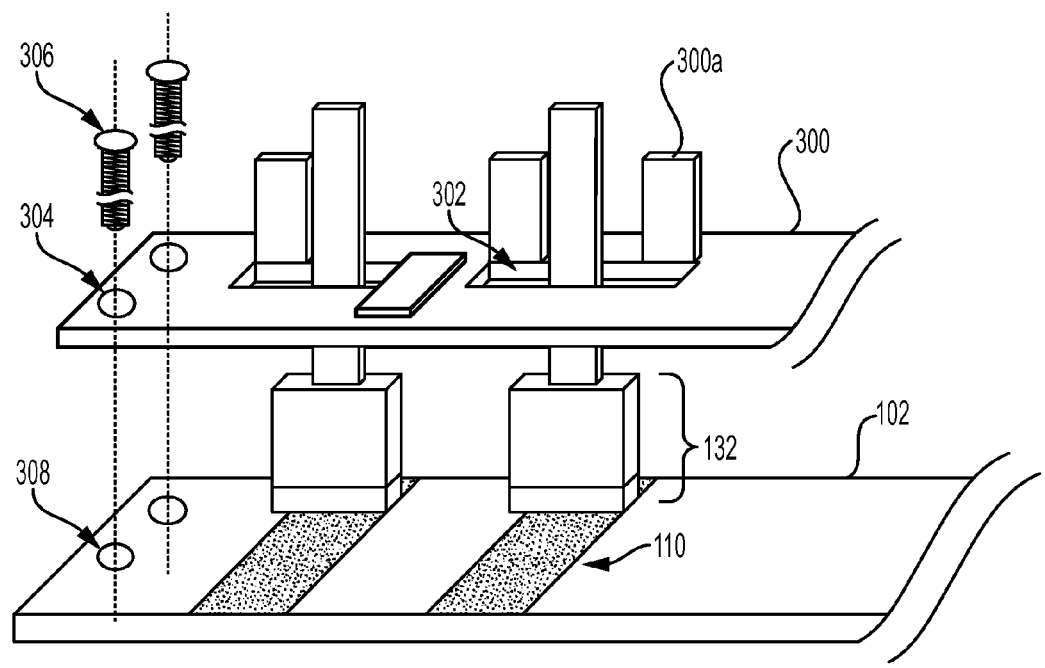
FIG. 15 is a diagram showing another fixture used to fix a fiber connector constituting the optical connector assembly to a substrate.

FIG. 15 is a diagram showing another fixture 300 used to fix a fiber connector 150 constituting the optical connector assembly 132 to a substrate 102. FIG. 15 is a perspective view of the substrate 102, the optical connector assembly 132, and the fixture 300.

As in the case of the fixture shown in FIG. 14, the fixture 300 shown in FIG. 15 has an opening 302 and a fastening hole 304 for inserting the optic fiber ribbon 130 of each optical connector assembly 132. The opening 302 provided in the fixture 300 has dimensions at least allowing the fiber connector 150 to pass through, and a stopper 300a opening and closing a portion of the opening 302 is provided on the periphery of the opening 302. After the fiber connector 150 has been inserted into the opening 302, the stopper 300a is lowered to close a portion of the opening 302 to keep the optical fiber ribbon 130 from coming out of the fixture 300.

The fixture 300 shown in FIG. 15 can also fix the optical connector assembly 132 between the upper surface of the substrate 102 and the bottom surface of the fixture 300 by inserting the optical fiber ribbon 130, and passing a fastening member 306 such as a screw through the fastening hole 304 and screwing it into the fastening hole 308 on the substrate 102 side.

Use of the fixture 300 shown in FIGS. 14(A) and 14(B) or FIG. 15 can improve resistance to the tensile force applied to the optic fiber ribbon 130 compared to a situation in which it is simply fixed using an adhesive as shown in FIG. 11 through FIG. 13(B).

Second Embodiment

In the optical connector assembly 132 of the first embodiment described above, the substrate-side component 140 and the fiber connector 150 are two separate components. The integrally molded substrate-side component 140 is provided with a hole or groove 146 as a coupling portion for coupling the component to the fiber connector 150. In other words, in the first embodiment, the substrate-side component 140 serves as both a lens array unit containing the waveguide-side microlens array 142 and a holder unit supporting the fiber connector 150.

The following is an explanation of a second embodiment with reference to FIGS. 16(A)-16(B) and FIGS. 17(A)-17 (C) in which the fiber holder 460 for supporting the fiber connector 450 is a separate component from the lens array 440 containing the microlens array. FIGS. 16(A)-16(B) and FIGS. 17(A)-17(C) are used to explain an embodiment in which there are four rows of reflective surfaces M in the waveguide layers, and four rows in the corresponding microlens array.

Figure 16A:
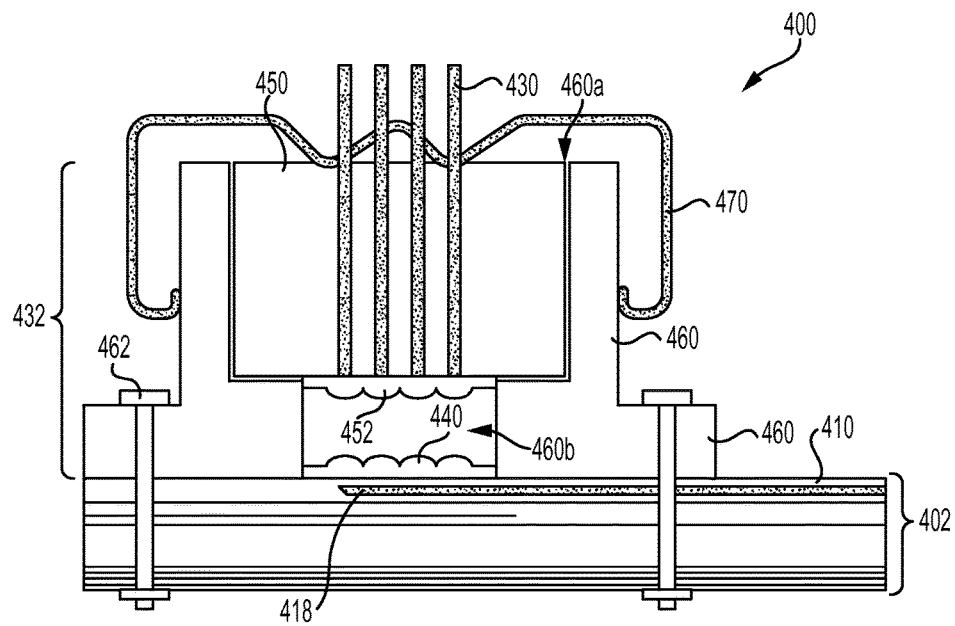
FIGS. 16(A) and 16(B) are diagrams schematically illustrating the connection structure between an optical multichip module in a second embodiment of the present invention and an optic fiber ribbon (1/2).
Figure 16B:
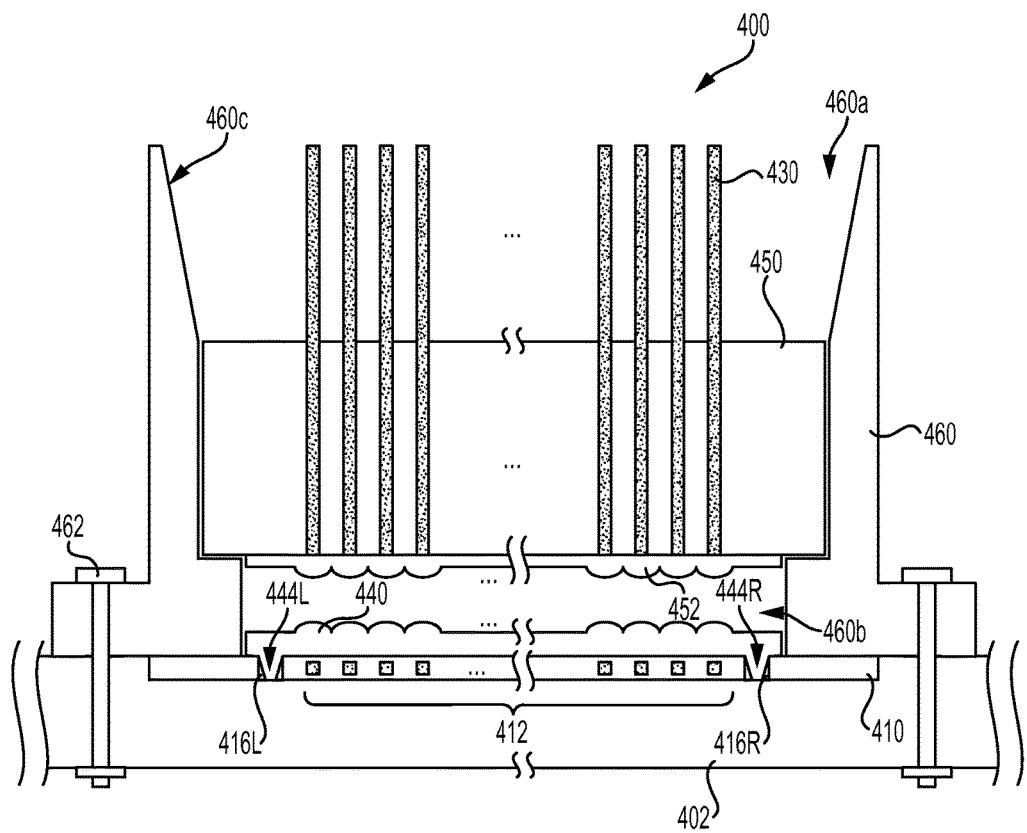
Figure 17A:
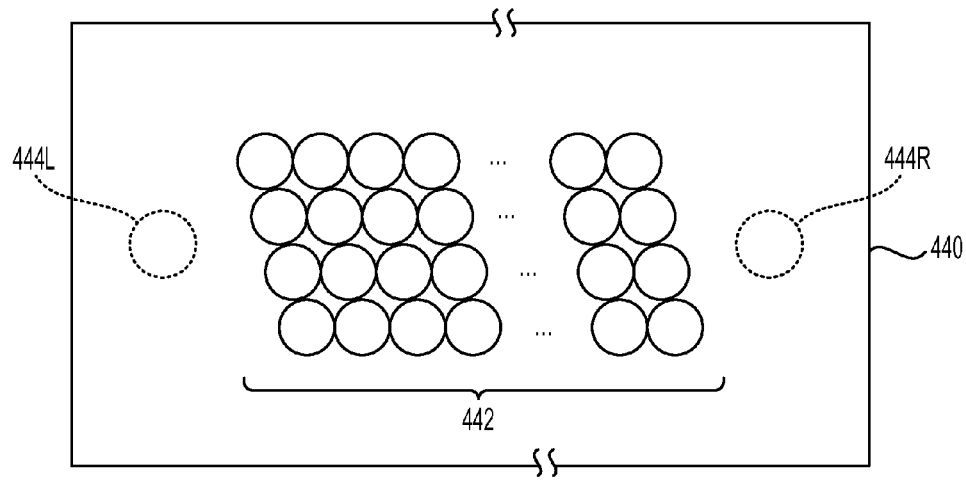
FIGS. 17(A), 17(B) and 17(C) are diagrams schematically illustrating the connection structure between the optical multichip module in the second embodiment and the optic fiber ribbon (2/2).
Figure 17B:
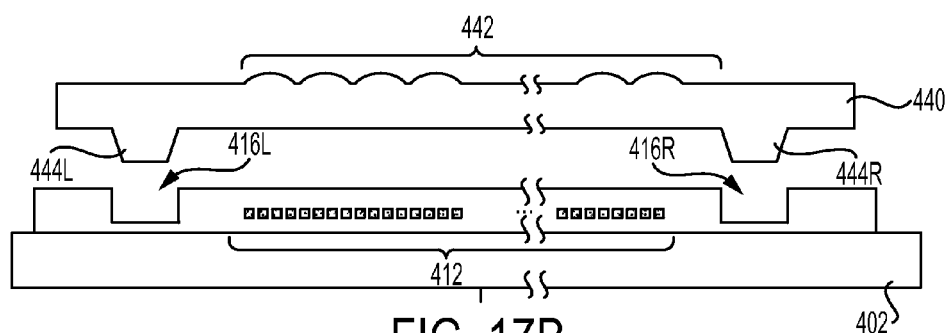
Figure 17C:
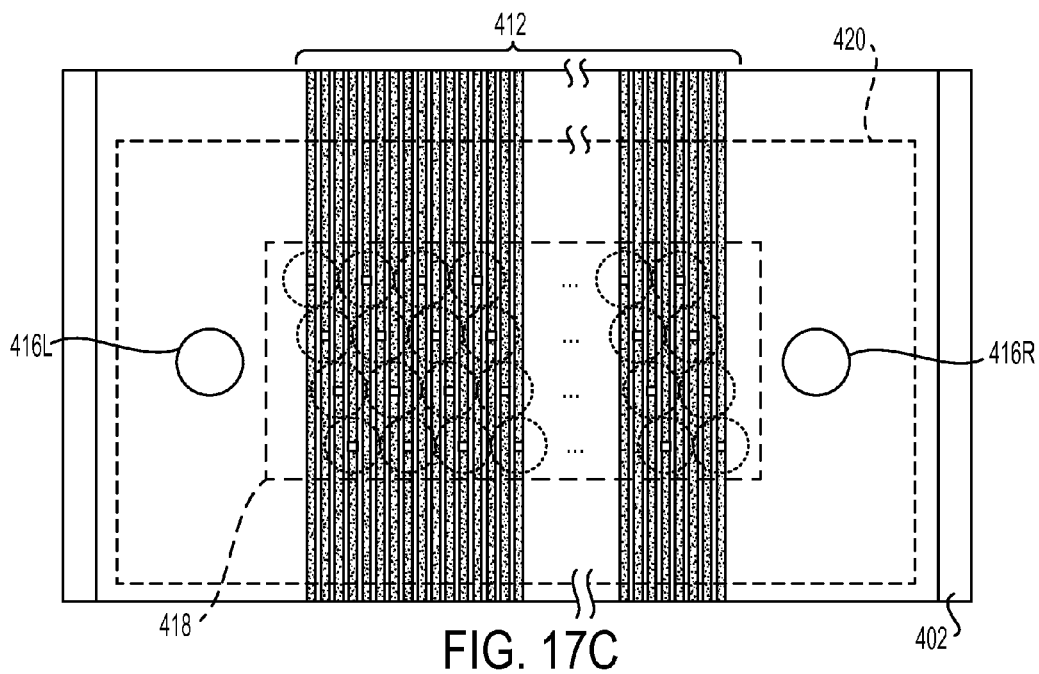

FIGS. 16(A)-16(B) and FIGS. 17(A)-17(C) are diagrams schematically illustrating the connection structure between an optical MCM 400 in a second embodiment of the present invention and an optic fiber ribbon 430. FIG. 16(A) is a side view towards the axial direction of the waveguides, and FIG. 16(B) is a side view away from the axial direction of the waveguides. FIG. 17(A) is a top view of the lens array 440, and FIG. 17(C) is a top view of the substrate 402. FIG. 17(B) is a side view of the lens array 440 and the substrate 402 away from the axial direction of the waveguides, and is a cross-sectional view of the lens array 440 and the substrate 402 cut away in the center. This is done to schematically illustrate the microlenses provided longitudinally in the center. In FIG. 17(A), the pins 444L, 444R provided in the bottom surface of the lens array 440 are denoted by dotted lines.

In the second embodiment, as in the first embodiment, reflective surfaces 418 with a 45° incline are formed on the end portion of each waveguide 412 in the waveguide layers 110, and the optical connector assembly 432 in the second embodiment is arranged at the location of the reflective surfaces 418 on the substrate 402.

The optical connector assembly 432 in the second embodiment of the present invention includes a lens array 440 incorporating the waveguide-side microlens array 442, a fiber connector 450 incorporating the fiber-side microlens array 452, and a fiber holder 460 accommodating the lens array 440 and the fiber connector 450.

The lens array 440 is positioned on the substrate 102 so that each microlens in the microlens array 452 is aligned with the reflective surface 418 formed in each waveguide.

The lens array 440 and the substrate 402 in the second embodiment of the present invention also include an alignment mechanism. In the embodiment explained here, as shown in FIG. 16(B) and FIGS. 17(A)-17(C), one portion constituting the alignment mechanism of the lens array 440 is a pair of tapered protrusions (pins) 444L, 444R formed on both sides of the region corresponding to the waveguide-side microlens array 442 in the bottom surface. In the waveguide layers 410 of the substrate 402, the pair of grooves 416L, 416R in which the pins 444L, 444R are to be inserted are provided on the substrate 402.

The grooves 416 are provided in the waveguide layer by laser processing after patterning with photolithography or formation of the waveguide layers 410. Because the pins 444L, 444R are tapered, the lens array 440 can be positioned in the proper location on the waveguide layers 410 easily and with great precision. The lens array 440 is fixed to the waveguide layers 410 using an adhesive.

In the fiber holder 460, an upper opening 460a is provided in the upper portion for accommodating the fiber connector 450, and a lower opening 460b is provided in the lower portion for accommodating the lens array 440. The upper opening 460a and the lower opening 460b are formed so that, when the fiber connector 450 and the lens array 440 are accommodated, each of the lenses in the fiber-side microlens array 452 is aligned with the corresponding waveguide-side microlens array 442.

The lower opening 460b is formed with dimensions that can enclose the lens array 440 with a slight gap. When the fiber holder 460 is installed on the substrate 402, the lens array 440 positioned on the substrate 402 is accommodated in the lower opening 460b. The fiber holder 460 is fixed to the substrate 402 using, for example, a pin 462.

The upper opening 460a also has dimensions that can accommodate the fiber connector 450 within a certain margin. The fiber connector 150 is inserted into the recess in the upper opening 460a to align each microlens in the fiber-side microlens array 452 with a microlens in the waveguide-side microlens array 442. The bottom surface in the recess in the upper opening 460a comes into contact with the fiber connector 450 in order to keep each microlens in the fiber-side microlens array 452 parallel with each microlens in the waveguide-side microlens array 442 accommodated in the lower opening 460b.

A taper 460c is formed in the upper opening 460a, as shown in FIG. 16(B), to allow the fiber connector 450 to be inserted more easily from above. The fiber connector 450 accommodated in the upper opening 460a is fixed to the fiber holder 460 on individual substrates 402 using a latch release mechanism 470 such as a plate-spring clip.

Because the embodiment described above connects optic fibers to the top surface of a substrate from above, spatial constraints are more relaxed compared to situations in which optic fibers are connected to the side surface of a substrate. At the same time, by coupling waveguides to optic fibers via both microlens arrays, the alignment tolerance between waveguides and optic fibers can also be relaxed. The alignment tolerance between waveguides and optic fibers is typically relaxed by a factor of ten compared to situations in which waveguides and optic fibers are aligned directly. For example, when the targeted loss is 0.5 dB or less, an alignment tolerance of several micrometers is required in the prior art. However, in a configuration embodying the present invention, this can be relaxed to several dozen micrometers.

In the prior art, it is difficult to narrow the waveguides and make the overall optical connector more compact because the pitch distance between optic fibers is fixed. By using the configuration described above, the size of the optical connector assembly itself can be reduced, and more optical connector assemblies can be arranged over a mounting area of the same size to increase the number of channels and increase bandwidth. Because optical MCMs can be created with multichannel optical signal input-output units near semiconductor circuit chips on mounting substrates, the demand for higher speed optical interconnects with reduced power consumption can be met.

As described above, the present invention is able to provide an optical device, optical connector assembly, and optical connection method which are able to relax spatial constraints on and alignment tolerances in optical connection structures in which a waveguide array formed on a substrate connects to external optical transmission paths.

The present invention was explained using a specific embodiment, but the present invention is not limited to these specific embodiments and examples. The present invention can be altered in any way conceivable by a person of skill in the art, including other embodiments, additions, modifications, and deletions. Any mode or aspect realizing the actions and effects of the present invention is within the scope of the present invention.

REFERENCE SIGNS LIST 100, 400, 500: Optical MCMs
102, 200, 402, 502: Substrates
104: Electric input/output unit
106, 502: Electrical wiring
110, 410, 510: Waveguide layers
112, 118, 418, 512: Reflective surfaces
114, 514: Vias
116, 516: Underfill
120, 520: Semiconductor chips
122, 522: TIA/LIA
124, 524: LDD
126, 526: PD
128, 528: VCSEL
130, 430, 530: Optical fibers
132, 432: Optical connector assemblies
140: Substrate-side component
142, 152, 442, 452: Microlens arrays
144, 154: Microlenses
146: Hole or groove
148: Rectangular stud
150, 450: Fiber connectors
156: Rod-shaped stud
160, 202: Lower cladding layer
164: Core
166, 206: Upper cladding layer
168, 412: Waveguide arrays
170, 214: Dummy cores
172, 180: Grooves
190: Photocurable adhesive
192: Recess
204: Core layer
212: Groove
300: Fixture
302: Opening
304, 306: Fastening holes
306: Fastening member
416: Groove
440: Lens array
444: Pin
444, 460: Fiber holders
462: Pin
470: Latch release mechanism

The invention claimed is:

1. An optical connection method, comprising:
preparing a substrate including waveguide layers formed on a surface of the substrate, the waveguide layers including a waveguide array, the waveguide array including waveguides, each of the waveguides having a reflective surface;
forming a substrate-side component, the substrate-side component including a waveguide-side microlens array, the waveguide-side microlens array including a first plurality of microlenses;
providing an alignment mechanism for aligning the waveguide-side microlens array with the reflective surface, the waveguide-side microlens array facing the waveguide array so each of the first plurality of microlenses in the waveguide-side microlens array is aligned with the reflective surface, wherein the alignment mechanism comprises a portion of the alignment mechanism in the substrate-side component comprising at least a plurality of studs and a portion of the alignment mechanism in the substrate comprising at least a plurality of L-shaped dummy cores;
attaching the substrate-side component to the substrate by receiving and securing the plurality of studs of the substrate-side component and the plurality of the L-shaped dummy cores of the substrate, wherein the L-shaped dummy cores use a core material of the waveguides and are patterned at a same time as the waveguides; and
attaching a fiber connector with an optic fiber ribbon to the substrate-side component, the fiber connector with the optic fiber ribbon including a fiber-side microlens array, the fiber-side microlens array comprising a second plurality of microlenses, wherein the alignment mechanism further aligns the fiber-side microlens array with the waveguide-side microlens array, the alignment mechanism further comprising a portion of the alignment mechanism on the fiber connector with the optic fiber ribbon.

2. The optical connection method according to claim 1, wherein the forming the substrate-side component further comprising:
forming the waveguide array and the substrate-side component by patterning a core layer, filled with the core material, constituting a waveguide layer of the waveguide layers on the substrate; and
exposing the substrate-side component and forming an upper cladding layer to cover the core layer of the patterned waveguides.

3. The optical connection method according to claim 2, wherein the arranging the substrate-side component on the substrate further comprising aligning the plurality of studs, provided on a bottom surface of the substrate-side component, with respect to the plurality of dummy cores in the substrate.

4. The optical connection method according to claim 3, wherein the arranging the substrate-side component on the substrate further comprising attaching the substrate-side component to the substrate using the plurality of studs and the plurality of dummy cores.

5. The optical connection method according to claim 1, wherein the preparing the substrate further comprises forming a recessed portion across a portion of the reflective surface on the surface of the waveguide layer including the waveguide array formed therein, and applying a photocurable adhesive layer to the surface of the waveguide layer on the substrate, wherein the optical connection method further comprises:
exposing a microlens array portion arranged on the substrate to light so as to cure the photocurable resin and bond the bottom surface of the substrate side component to the waveguide layer.

6. The optical connection method according to claim 1, wherein the waveguide-side microlens array is in recesses provided in a top surface of the substrate-side component.

7. The optical connection method according to claim 1, wherein the fiber-side microlens array is in recesses provided in a bottom surface of the fiber connector.

8. The optical connection method according to claim 1, wherein the waveguide array is in a horizontal direction on the substrate in the waveguide layer.

* * * * *